US012785665B2

(12) United States Patent
Wang et al.

(10) Patent No.: US 12,785,665 B2
(45) Date of Patent: Nov. 3, 2026

(54) PROCESS VARIATION DETECTION AND ADAPTIVE VOLTAGE SCALING

(71) Applicant: Xilinx, Inc., San Jose, CA (US)

(72) Inventors: Zhaowen Wang, San Jose, CA (US); Nader Sharifi, San Jose, CA (US); Hsin Cheng Yu, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 19/047,912

(22) Filed: Feb. 7, 2025

(65) Prior Publication Data

US 2026/0238193 A1 Aug. 13, 2026

(51) Int. Cl.

| | |
|---|---|
| ***H03K 3/03*** | (2006.01) |
| ***G01R 31/28*** | (2006.01) |
| ***G01R 31/317*** | (2006.01) |
| ***G06F 1/324*** | (2019.01) |
| ***G06F 1/3296*** | (2019.01) |

(52) U.S. Cl.

CPC ....... *H03K 3/0315* (2013.01); *G01R 31/2874* (2013.01); *G01R 31/2882* (2013.01); *G01R 31/31725* (2013.01); *G06F 1/324* (2013.01); *G06F 1/3296* (2013.01)

(58) Field of Classification Search

CPC ...... G06F 1/324; G06F 1/3296; G06F 1/3203; H03K 3/0315; G01R 31/3016; G01R 31/2882; G01R 31/31727; G01R 31/31725

See application file for complete search history.

(56) References Cited

U.S. PATENT DOCUMENTS

| | | | | |
|---|---|---|---|---|
| 2008/0136400 | A1* | 6/2008 | Chi | G06F 1/3296 323/318 |
| 2009/0085653 | A1* | 4/2009 | Inoue | G06F 30/367 700/298 |
| 2011/0187419 | A1* | 8/2011 | Ikenaga | G06F 1/324 327/540 |
| 2018/0034452 | A1* | 2/2018 | Lu | H03K 5/1565 |
| 2018/0175858 | A1* | 6/2018 | Hoede | H03K 19/17784 |

OTHER PUBLICATIONS

Iizuka et al., "Buffer-ring-based all-digital on-chip monitor for PMOS and NMOS process variability and aging effects," 13th IEEE Symposium on Design and Diagnostics of Electronic Circuits and Systems, Vienna, Austria, 2010, pp. 167-172, doi: 10.1109/DDECS.2010.5491792.

Sundaresan et al., "Process and temperature compensation in a 7-MHz CMOS clock oscillator," in IEEE Journal of Solid-State Circuits, vol. 41, No. 2, pp. 433-442, Feb. 2006, doi: 10.1109/JSSC.2005.863149.

* cited by examiner

*Primary Examiner* — Ryan Johnson
(74) *Attorney, Agent, or Firm* — Slater Matsil, LLP

(57) ABSTRACT

A system includes a plurality of ring oscillators, a controlled circuit, and a controller operably coupled to the plurality of ring oscillators and the controlled circuit. The controller is configured to operate one or more of the plurality of ring oscillators based on the controlled circuit and provide a voltage code to the controlled circuit based on analyzing oscillation behaviors of the one or more of the plurality of ring oscillators.

20 Claims, 14 Drawing Sheets

500

| Oscillation Mode | | | | | | |
|---|---|---|---|---|---|---|
| Stage | ro | rob | rst1 | rstb1 | rst2 | rstb2 |
| 1 | 1 | 0 | 0 | 1 | 0 | 1 |
| N+1 | 0 | 1 | 0 | 1 | 0 | 1 |
| Others | 0 | 1 | 0 | 1 | 0 | 1 |

*Figure 5*

600

| Burst Mode | | | | | | |
|---|---|---|---|---|---|---|
| Stage | ro | rob | rst1 | rstb1 | rst2 | rstb2 |
| 1 | 0 | 1 | 1 | 0 | **0** | **0 ->1** |
| N+1 | 0 | 1 | 1 | 0 | **1->0** | **1** |
| Others | 0 | 1 | 0 | 1 | 0 | 1 |

*Figure 6*

PROCESS VARIATION DETECTION AND ADAPTIVE VOLTAGE SCALING

BACKGROUND

Integrated circuits operate across various process, voltage, and temperature (PVT) conditions that can impact their performance. These variations necessitate design considerations to ensure reliable operation across all corners, particularly at the slowest operating conditions. Circuit designers traditionally address PVT variations by upsizing components to meet specifications at worst-case conditions, which often results in overdesigned circuits that consume more power and area than necessary at nominal or faster operating conditions.

Supply voltage regulation and adaptation techniques have emerged as methods for managing circuit performance across different operating conditions. Traditional approaches utilize ring oscillators to monitor and detect PVT variations. However, existing monitoring systems face challenges in independently characterizing NMOS and PMOS transistor variations, which limits their effectiveness in optimizing power and performance for circuits where one transistor type may dominate.

BRIEF DESCRIPTION OF THE DRAWINGS

For a more complete understanding of the present disclosure, and the advantages thereof, reference is now made to the following descriptions taken in conjunction with the accompanying drawings.

FIG. 5 illustrates waveforms of a CMOS ring oscillator, in accordance with some implementations.

FIG. 6 illustrates a bit configuration table for a CMOS ring oscillator in oscillation mode, in accordance with some implementations.

Figure 1:
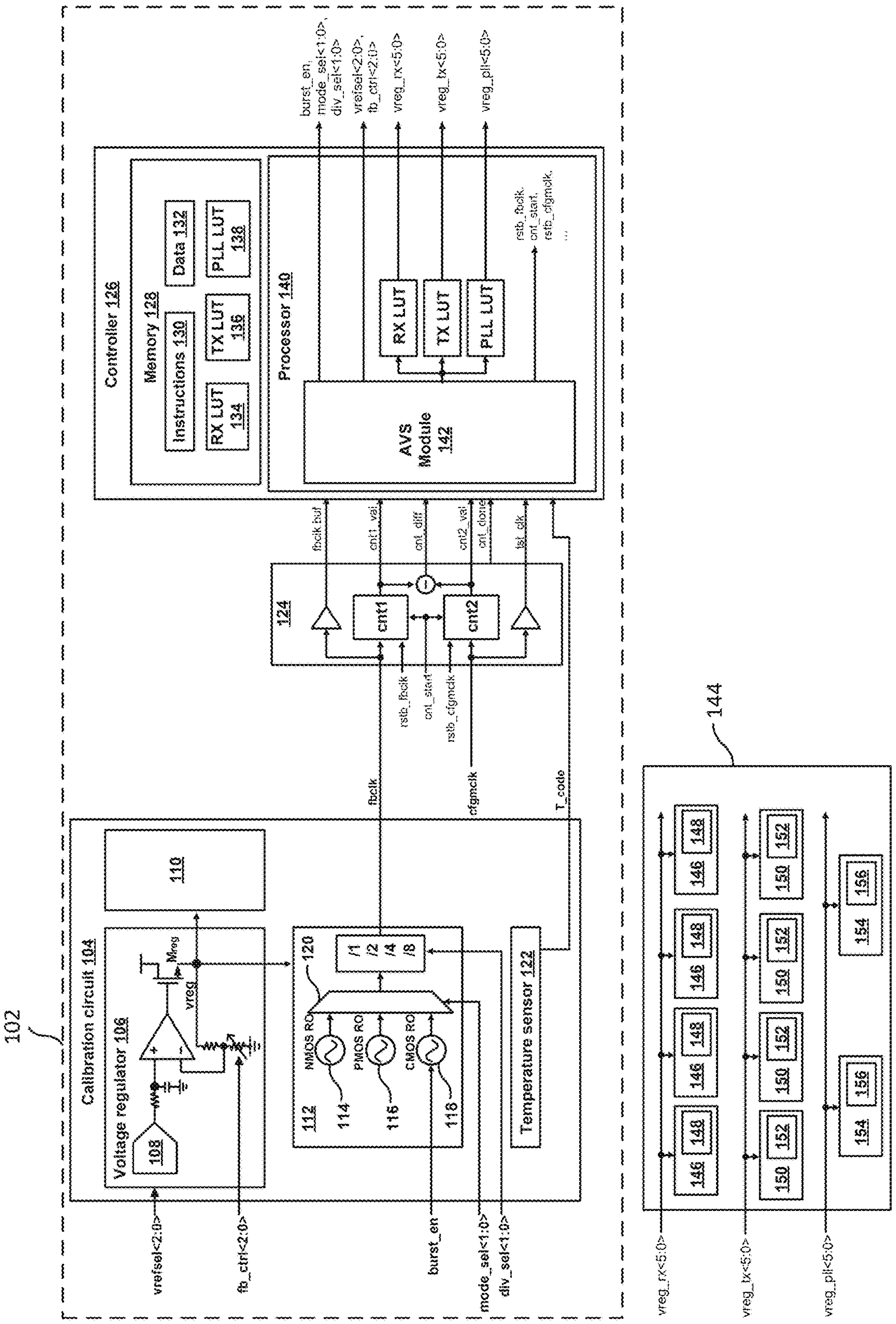
FIG. 1 illustrates a block diagram of an adaptive voltage scaling system coupled to controlled circuits, in accordance with some implementations.

Corresponding numerals and symbols in the different figures generally refer to corresponding parts unless otherwise indicated. The figures are drawn to clearly illustrate the relevant aspects of the implementations and are not necessarily drawn to scale. The edges of features drawn in the figures do not necessarily indicate the termination of the extent of the feature.

DETAILED DESCRIPTION OF ILLUSTRATIVE IMPLEMENTATIONS

The making and using of various implementations are discussed in detail below. It should be appreciated, however, that the various implementations described herein are applicable in a wide variety of specific contexts. The specific implementations discussed are merely illustrative of specific ways to make and use various implementations, and should not be construed in a limited scope.

Reference to “an implementation,” “one implementation,” “an embodiment,” or “one embodiment” in the framework of the present description is intended to indicate that a particular configuration, structure, or characteristic described in relation to the implementation/embodiment is included in at least one implementation/embodiment. Hence, phrases such as “in one implementation” or “in one embodiment” that may be present in one or more points of the present description do not necessarily refer to one and the same implementation/embodiment. Moreover, particular conformations, structures, or characteristics may be combined in any adequate way in one or more implementations/embodiments. The references used herein are provided merely for convenience and hence do not define the extent of protection or the scope of the implementations/embodiments.

An adaptive voltage scaling system is provided that utilizes specialized ring oscillators to detect and compensate for process variations in integrated circuits. The system comprises three types of ring oscillators: an NMOS-only ring oscillator that monitors NMOS transistor characteristics, a PMOS-only ring oscillator that monitors PMOS transistor characteristics, and a configurable CMOS ring oscillator that can operate in both oscillation and burst modes. Based on the oscillation frequencies and supply voltage adjustments needed to achieve target frequencies, the system can detect process variations and optimize supply voltages for different circuit blocks.

The system determines process corners by comparing ring oscillator frequencies to reference values and distinguishes between balanced corners (SS, TT, FF) and skewed corners (SF, FS) using an exclusion zone methodology. For skewed corners, a burst mode operation of the CMOS ring oscillator provides additional verification by analyzing pulse counts and final settled states. The system adaptively adjusts supply voltages to compensate for process variations, enabling reduced transistor sizing and lower power consumption while maintaining performance targets across different operating conditions. The optimization can be tailored for circuits dominated by either NMOS or PMOS devices, providing improved voltage regulation compared to conventional approaches.

Various implementations of the present disclosure offer several advantages. In various implementations, the adaptive voltage scaling system provides improvements over conventional approaches by enabling independent detection and compensation of NMOS and PMOS process variations. Implementations of this system can identify balanced process corners (SS, TT, FF) as well as distinguish skewed corners (SF, FS) through the combination of NMOS-only and PMOS-only ring oscillators along with a configurable CMOS ring oscillator. This capability allows for improved voltage optimization, particularly beneficial for circuits dominated by either NMOS or PMOS devices.

The system enables reduced transistor sizing since the adaptive voltage scaling compensates for process variations, resulting in decreased circuit area and power consumption. In an implementation, the system achieves approximately 15% reduction in circuit area and power consumption compared to conventional designs that must be sized for worst-case corners. Additionally, the burst-mode operation of the CMOS ring oscillator provides an improved method for verifying process skew while avoiding potential issues with pulse width degradation that can affect reliability in traditional implementations.

FIG. 1 illustrates a block diagram of an adaptive voltage scaling (AVS) system 102 coupled to controlled circuits 144, in accordance with some implementations. In various implementations, the AVS system 102 is configured to optimize voltage regulation and circuit performance of the controlled circuits across different operating conditions. The AVS system 102 may comprise a calibration circuit 104, a frequency counter circuit 124, and a controller 126.

The controlled circuits 144 may comprise circuits of different types. In some implementations, the controlled circuits 144 may comprise circuits 146 of a first type, circuits 150 of a second type, and circuits 154 of a third type. The circuits 146, 150 and 154 comprise voltage regulators 148, 152 and 156, respectively. In some implementations, the voltage regulators 148, 152 and 156 comprise DACs.

In the illustrated implementation, the circuits 146 are receiver circuits (RX), the circuits 150 are transmitter circuits (TX), and the circuits 154 are phase-locked loop circuits (PLL). In some implementations, the voltage regulators 148 are configured to receive voltage codes (vreg_rx<5:0>), the voltage regulators 152 are configured to receive voltage codes (vreg_tx<5:0>), and the voltage regulators 156 are configured to receive voltage codes (vreg_pll<5:0>). The voltage codes may be also referred to as voltage regulator codes or regulator codes.

In some implementations, the calibration circuit 104 comprises a voltage regulator 106, a process corner sensor 112, and a temperature sensor 122. The process corner sensor 112 comprises three ring oscillators (ROs). The NMOS RO 114 uses NMOS transistors to detect NMOS process variations, while the PMOS RO 116 employs PMOS transistors to detect PMOS process variations. The CMOS RO 118 incorporates both transistor types for overall process monitoring. The ring oscillators are configured to generate oscillating signals. A multiplexer 120 selects between the three ring oscillator outputs for frequency measurement. In some implementations, the NMOS RO 114 may be implemented by an NMOS RO 200 described below with reference to FIG. 2, PMOS RO 116 may be implemented by a PMOS RO 300 described below with reference to FIG. 3, and the CMOS RO 118 may be implemented by a CMOS RO 400 described below with reference to FIG. 4.

The voltage regulator 106 is configured to generate a regulated voltage output and may include control circuitry for stable voltage generation. In some implementations, the voltage regulator 106 comprises a digital-to-analog converter (DAC) 108. Control signals vrefsel<2:0> configure the reference voltage levels for the DAC 108. In an implementation, the voltage regulator 106 may include feedback mechanisms to maintain stable output voltages across temperature and load variations. In some implementations, additional calibration circuitry 110 may provide fine-tuning capabilities for the voltage regulator 106, allowing for regulated voltage levels across different operating conditions through continuous monitoring and adjustment.

A temperature sensor 122 is configured to monitor a temperature of a die and generate a temperature code (T_code) that quantifies temperature variations. The temperature sensor 122 may be a band-gap temperature sensor or the like.

A frequency counter circuit 124 is coupled to the calibration circuit 104 and is configured to receive an fbclk signal from the process corner sensor 112 and compare the fbclk signal to a reference signal (cfgmclk). The frequency counter circuit 124 includes configurable timing windows controlled by cnt_start and cnt_done signals and generates cnt1_val, cnt2_val, and cnt_diff signals. The cnt1_val signal encodes a pulse count for the fbclk signal, the cnt2_val signal encodes a pulse count for the reference signal (cfgmclk), and the cnt_diff signal encodes their difference.

The controller 126 is operably coupled to the calibration circuit 104, the frequency counter circuit 124, and the controlled circuits 144. The controller 126 is configured to detect process corners, calibrate the controlled circuits 144 and generate voltage codes based on the detected process corners and temperature conditions. In some implementations, the controller 126 is configured to perform methods 900-1400 described below with reference to FIGS. 9A, 9B, 10, 11, 12A, 12B, 13, and 14, respectively.

In some implementations, the controller 126 is configured to orchestrate system operation through multiple control signals and state machines. The mode_sel<1:0> signal controls the multiplexer 120 of the process corner sensor 112, while burst_en signal enables the burst mode for the CMOS RO 118. The div_sel<1:0> configures frequency division ratios to accommodate different frequency ranges. The vrefsel<2:0> and fb_ctrl<2:0> signals control operations of the voltage regulator 106. The fb_ctrl<2:0> signals provide feedback for closed-loop control, enabling dynamic voltage adjustment based on real-time conditions. The controller 126 is configured to generate voltage codes (e.g., vreg_rx<5:0>, vreg_tx<5:0>, vreg_pll<5:0>) and provide the voltage codes to the controlled circuits 144.

The controller 126 may be implemented in a wide variety of manners. For example, the controller 126 may be a computing device comprising a processor 140 operable coupled to a memory 128. The processor 140 may comprise one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions 130 to implement the functionality of the AVS system 102.

In some implementations, the software or other programming instructions 130 can be stored in the memory 128. The memory 128 may comprise one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions 130, when executed by the processor 140, cause the processor 140 to perform the processes, functions, and/or capabilities described herein. In some implementations, the instructions 130, when executed by the processor 140, cause the processor 140 to implement AVS module 142.

The memory 128 may further store data 132 and look-up tables (LUTs) that correspond to each type of controlled circuits 144. For example, the memory 128 includes RX LUT 134 corresponding to receiver circuits 146, TX LUT 136 corresponding to transmitter circuits 150, and PLL LUT 138 corresponding to PLL circuits 154. The data 132 comprise various data elements that may be used by the processor 140 while executing the instructions 130. In the illustrated implementation, the RX LUT 134 is configured to store vreg_rx<5:0>, the TX LUT 136 configured to store vreg_tx<5:0>, and the PLL LUT 138 is configured to store vreg_pll<5:0>. As described below in greater detail, in some implementations, controller 126 determines voltage codes (e.g., vreg_rx<5:0>, vreg_tx<5:0>, and vreg_pll<5:0>) for each type of controlled circuits 144 based on oscillation behavior of the NMOS RO 114, the PMOS RO 116, and/or CMOS RO 118, and stores the determined voltage codes in respective LUTs (e.g., RX LUT 134, TX LUT 136, and PLL LUT 138). When operating controlled circuits 144, controller 126 retrieves the stored voltage codes from respective LUTs and provides the stored voltage codes to respective types of controlled circuits 144. For example, vreg_rx<5:0> is provided to receiver circuits 146, vreg_tx<5:0> is provided transmitter circuits 150, and vreg_pll<5:0> is provided to PLL circuits 154.

Figure 2:
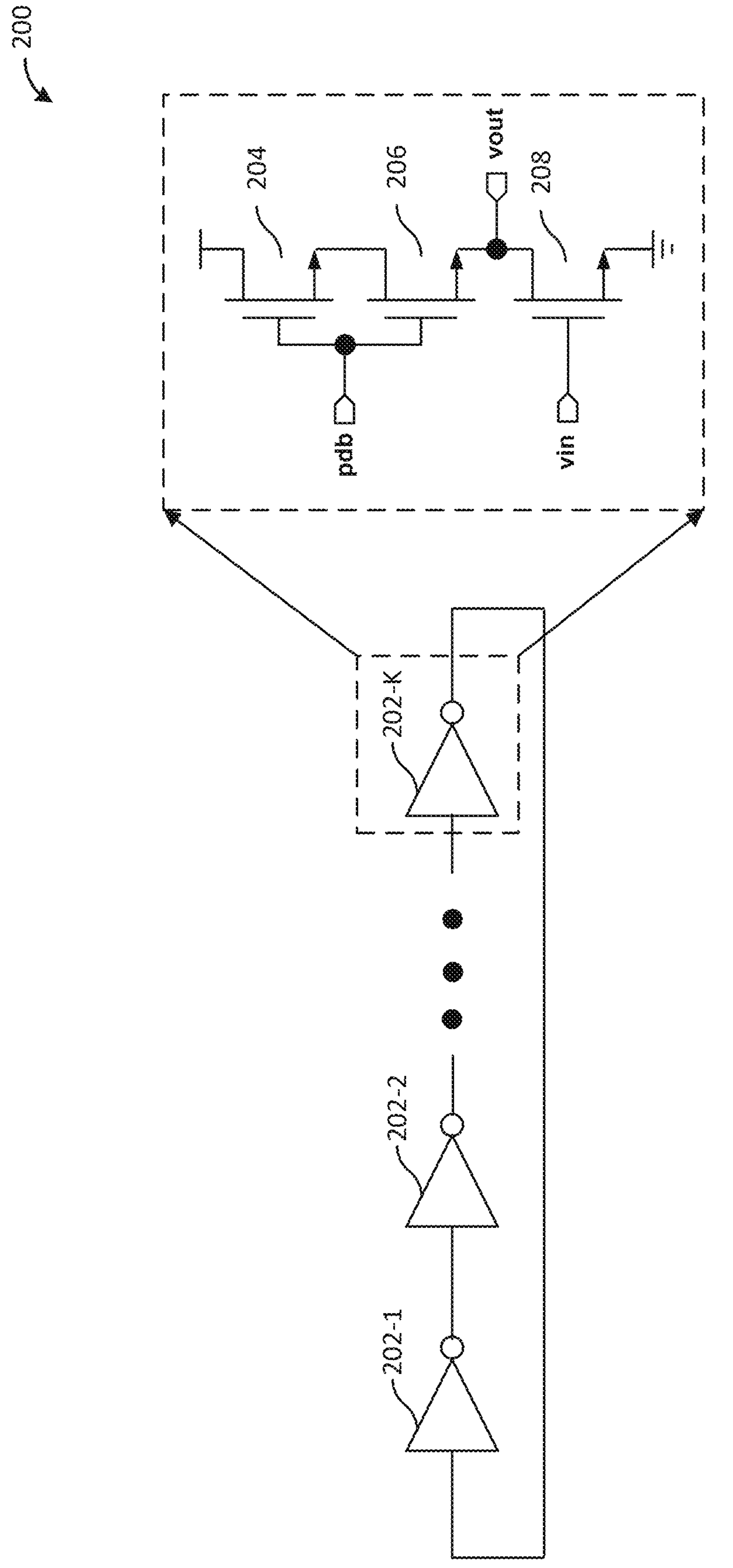
FIG. 2 illustrates a schematic of an NMOS ring oscillator, in accordance with some implementations.

FIG. 2 illustrates a schematic of an NMOS ring oscillator (RO) 200, in accordance with some implementations. The NMOS RO 200 may be used to implement the NMOS RO 114 of the AVS system 102 (see FIG. 1). The NMOS RO 200 allows for targeted monitoring of NMOS transistor characteristics independent of PMOS variations.

The NMOS RO 200 comprises a series of stages 202-1 through 202-K, where K represents the total number of stages in the NMOS RO 200. In an implementation, odd number of stages 202-1 through 202-K are connected in series to form a closed loop that enables sustained oscillation. Each of the stages 202-1 through 202-K utilizes only NMOS transistors in its signal path to ensure the oscillation frequency depends solely on NMOS characteristics.

In the illustrated implementation, the stages 202-1 through 202-K comprise inverters. Each of the stages 202-1 through 202-K comprises NMOS transistors 204-208. Gates of the NMOS transistors 204 and 206 are both connected to a power-down control node pdb. A gate of the NMOS transistor 208 is connected to input node vin, receiving the signal from a previous stage. A source of the NMOS transistor 206 and a drain of the NMOS transistor 208 are connected to an output node vout that is coupled to the input node vin of the next stage of the NMOS RO 200.

In various implementations, transistors of the stages 202-1 through 202-K of the NMOS RO 200 are selected such that they are of the same type as transistors used in the controlled circuits 144. For example, an ultra-low-voltage transistor (ULVT) NMOS RO may be used to detect the ULVT NMOS process corner of ULVT NMOS transistors, while a low-voltage transistor (LVT) NMOS RO may be used to detect the LVT NMOS process corner of LVT NMOS transistors.

The number of stages K is selected to be an odd number to ensure proper oscillation. In the illustrated implementation, the NMOS RO 200 is in the oscillation mode when the node pdb is set to 1 and in the power-down mode when the node pdb is set to 0. In one or more implementations, the NMOS-only design eliminates the influence of PMOS device variations, providing a more accurate assessment of NMOS process characteristics. This isolated measurement capability enables improved calibration of voltage levels for circuits dominated by NMOS device performance.

The oscillator frequency the NMOS RO 200 may be used to identify process corners, such as slow(S), typical (T), and fast (F). For example, oscillator frequency of S corner is less than oscillator frequency of T corner, and, oscillator frequency of T corner is less than oscillator frequency of F corner. In some implementations, a process corner of the NMOS RO 200 may be identified by comparing the oscillator frequency to a reference frequency.

In some implementations when the process corner of the NMOS RO 200 is slow(S) or fast (F), the performance of the NMOS RO 200 may be brought to the typical performance by adjusting a supply voltage. In an implementation when the process corner of the NMOS RO 200 is slow(S), the performance of the NMOS RO 200 may be brought to the typical performance by increasing the supply voltage. In an implementation when the process corner of the NMOS RO 200 is fast (F), the performance of the NMOS RO 200 may be brought to the typical performance by decreasing the supply voltage.

Figure 3:
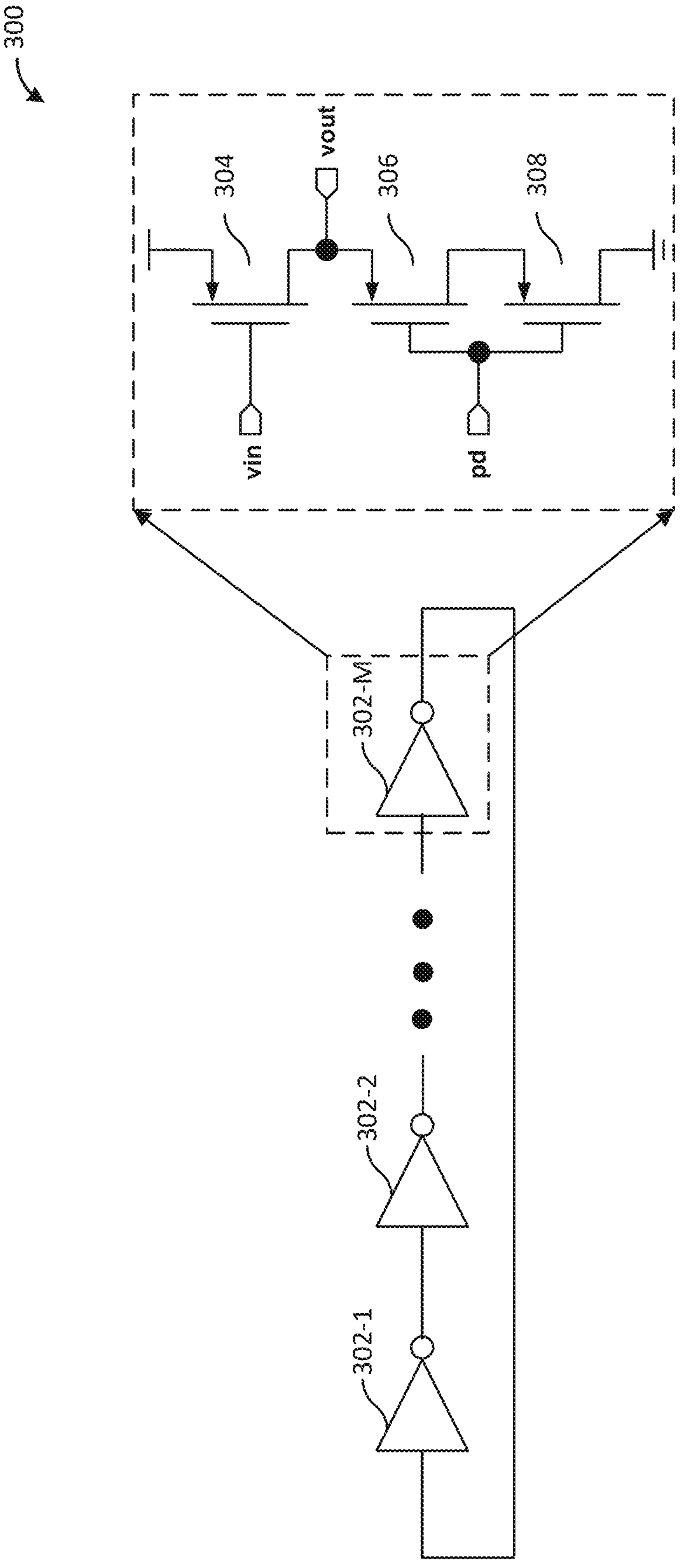
FIG. 3 illustrates a schematic of a PMOS ring oscillator, in accordance with some implementations.

FIG. 3 illustrates a schematic of a PMOS ring oscillator (RO) 300, in accordance with some implementations. The PMOS RO 300 may be used to implement the PMOS RO 116 of the AVS system 102 (see FIG. 1). The PMOS RO 300 allows for targeted monitoring of PMOS transistor characteristics independent of NMOS variations.

The PMOS RO 300 comprises a series of stages 302-1 through 302-M, where M represents the total number of stages in the PMOS RO 300. In an implementation, odd number of stages 302-1 through 302-M are connected in series to form a closed loop that enables sustained oscillation. Each of the stages 302-1 through 302-M utilizes only PMOS transistors in its signal path to ensure the oscillation frequency depends solely on PMOS characteristics.

In the illustrated implementation, the stages 302-1 through 302-M comprise inverters. Each of the stages 302-1 through 302-K comprises PMOS transistors 304-308. Gates of the PMOS transistors 306 and 308 are both connected to a power-down control node pd. A gate of the PMOS transistor 304 is connected to input node vin, receiving the signal from a previous stage. A source of the PMOS transistor 306 and a drain of the PMOS transistor 304 are connected to an output node vout that is coupled to the input node vin of the next stage of the PMOS RO 300.

In various implementations, transistors of the stages 302-1 through 302-M of the PMOS RO 300 are selected such that they are of the same type as transistors used in the controlled circuits 144. For example, an ultra-low-voltage transistor (ULVT) PMOS RO may be used to detect the ULVT PMOS process corner of ULVT PMOS transistors, while a low-voltage transistor (LVT) PMOS RO may be used to detect the LVT PMOS process corner of LVT PMOS transistors.

The number of stages M is selected to be an odd number to ensure proper oscillation. In the illustrated implementation, the PMOS RO 300 is in the oscillation mode when the node pd is set to 0 and in the power-down mode when the node pd is set to 1. In one or more implementations, the PMOS-only design eliminates the influence of NMOS device variations, providing a more accurate assessment of PMOS process characteristics. This isolated measurement capability enables improved calibration of voltage levels for circuits dominated by PMOS device performance.

The oscillator frequency the PMOS RO 300 may be used to identify process corners, such as slow (S), typical (T), and fast (F). For example, oscillator frequency of S corner is less than oscillator frequency of T corner, and, oscillator frequency of T corner is less than oscillator frequency of F corner. In some implementations, a process corner of the PMOS RO 300 may be identified by comparing the oscillator frequency to a reference frequency.

In some implementations when the process corner of the PMOS RO 300 is slow (S) or fast (F), the performance of the PMOS RO 300 may be brought to the typical performance by adjusting a supply voltage. In an implementation when the process corner of the PMOS RO 300 is slow (S), the performance of the PMOS RO 300 may be brought to the typical performance by increasing the supply voltage. In an implementation when the process corner of the PMOS RO 300 is fast (F), the performance of the PMOS RO 300 may be brought to the typical performance by decreasing the supply voltage.

Figure 4:
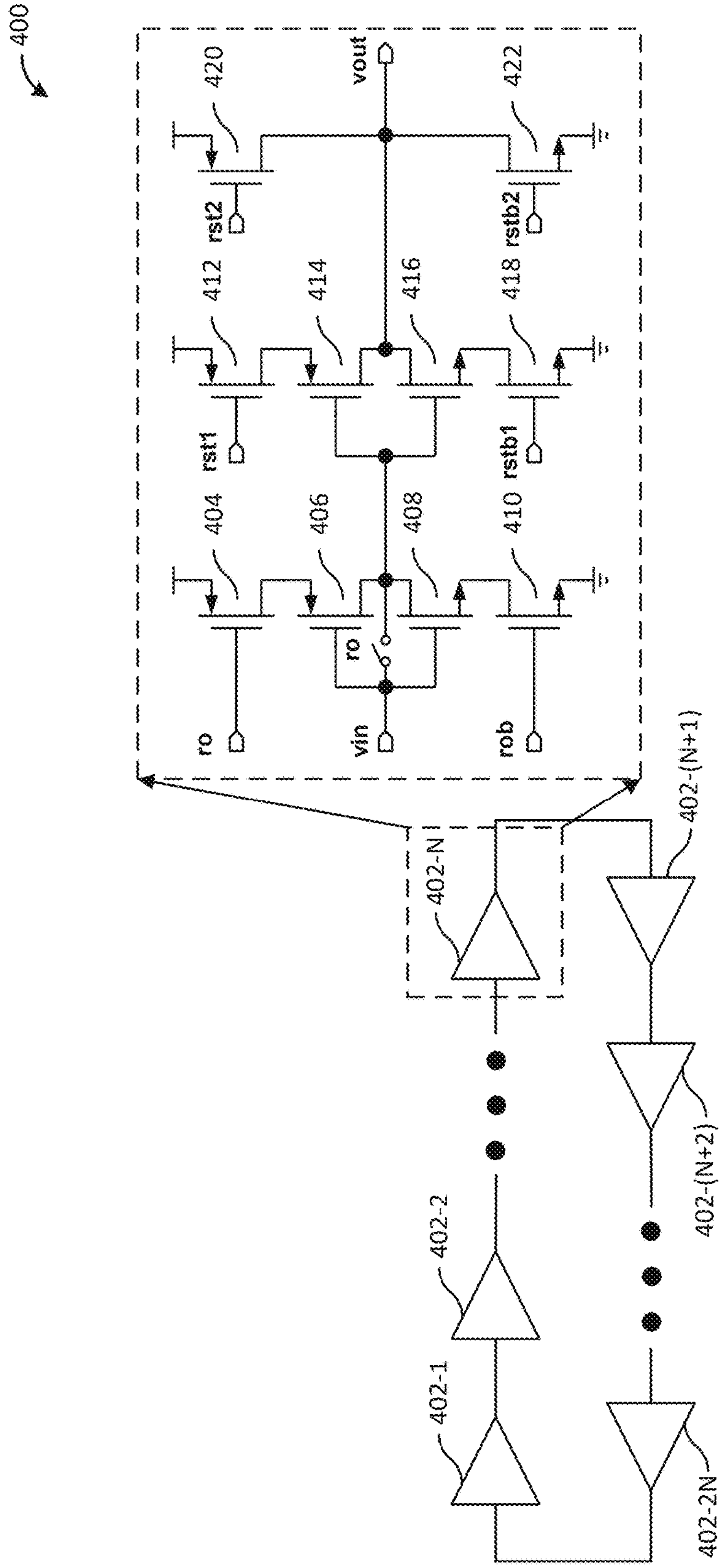
FIG. 4 illustrates a schematic of a CMOS ring oscillator, in accordance with some implementations.

FIG. 4 illustrates a schematic of a CMOS ring oscillator (RO) 400, in accordance with some implementations. The CMOS RO 400 is capable of operating in both oscillation and burst modes. The CMOS RO 400 may be used to implement the CMOS RO 400 118 of the AVS system 102 (see FIG. 1). The CMOS RO 400 comprises multiple stages 402-1 through 402-2N connected in a loop configuration, enabling process variation detection for both NMOS and PMOS transistors.

In some implementations, the CMOS RO 400 includes 2N stages, labeled from 402-1 through 402-2N, where N represents half the total number of stages. In the illustrated implementation, stages 402-1 through 402-N form the forward path, while stages 402-(N+1) through 402-2N form the return path.

In some implementation, each of the stages 402-1 through 402-2N comprises a buffer circuit that includes a plurality of inverters. In the illustrated implementation, each of the stages 402-1 through 402-2N comprises a first inverter comprising PMOS transistors 404 and 406 and NMOS transistors 408 and 410 and a second inverter comprising PMOS transistors 412 and 414 and NMOS transistors 416 and 418. Each of the stages 402-1 through 402-2N may further comprise PMOS transistor 420 and the NMOS transistor 422 forming an output stage.

In the illustrated implementation, a gate of the PMOS transistor 404 is connected to the node ro, a gate of the PMOS transistor 406 and a gate of the NMOS transistor 408 is connected to the node vin, a gate of the NMOS transistor 410 is connected to the node rob, a gate of the PMOS transistor 412 is connected to the node rst1, a gate of the NMOS transistor 418 is connected to the node rstb1, a gate of the PMOS transistor 420 is connected to the node rst2, a gate of the NMOS transistor 422 is connected to the node rstb2, and drains of the PMOS transistor 420 and the NMOS transistor 422 are connected to the node vout, which is connected to the next stage.

In some implementations, two inverters may be sized differently, so their fan-out ratios are different, and the rising delay and falling delay from node vin to node vout are thus different. This asymmetry enables detection of relative strengths between NMOS and PMOS devices during the burst mode operation. The sizing ratios may be optimized to provide improved sensitivity to process variations while maintaining reliable operation.

The CMOS RO 400 supports two operating modes (e.g., oscillation and burst modes). In the oscillation mode, the CMOS RO 400 functions as a traditional ring oscillator with an odd number of inversions in the loop. The oscillation mode allows for detecting balanced process corners such as slow-NMOS-slow-PMOS (SS), typical-NMOS-typical-PMOS (TT), fast-NMOS-fast-PMOS (FF), while may not be able to distinguish skewed process corners such as slow-NMOS-fast-PMOS (SF) and fast-NMOS-slow-PMOS (FS). In the burst mode, the CMOS RO 400 is configured to create a pulse propagation path that reveals process a skew between NMOS and PMOS devices. The burst mode allows for detecting both balanced and skewed process corners.

FIG. 5 illustrates a bit configuration table 500 for the CMOS RO 400 (see FIG. 4) in the oscillation mode, in accordance with some implementations. The bit configuration table 500 defines the control signal settings across different stages to enable proper oscillation operation. In various implementations, each control signal is assigned a binary value (e.g., 0 or 1) to establish the correct operating conditions.

For Stage 1, the configuration sets the node r0 to 1 and the node rob to 0, establishing the initial drive condition. The node rst1 is set to 0, the node rstb1 is set to 1, the node rst2 is set to 0, and the node rstb2 is set to 1. This specific combination allows for initialization of the oscillation sequence For Stage N+1, the configuration changes with the node ro set to 0 and the node rob to 1. The nodes rst1, rstb1, rst2, and rstb2 maintain the same signal pattern as Stage 1. In one or more implementations, this configuration ensures proper signal propagation through the CMOS RO 400.

All Other stages in the CMOS RO 400 maintain a consistent configuration with the node ro set to 0, the node rob set to 1, the node rst1 set to 0, the node rstb1 set to 1, the node rst2 set to 0, and the node rstb2 set 1. This uniform configuration for the remaining stages allows stable oscillation operation.

FIG. 6 illustrates a bit configuration table 500 for the CMOS RO 400 (see FIG. 4) in the burst mode, in accordance with some implementations. The bit configuration table 500 defines the control signal settings across different stages to enable burst mode operation for process variation detection. In various implementations, each control signal is assigned a binary value (e.g., 0 or 1) to establish the correct operating conditions.

For Stage 1, the configuration sets the node ro to 0 and the node rob to 1, establishing the initial condition. The node rst1 is set to 1, the node rstbi is set to 0, the node rst2 is set to 0, and the node rstb2 transitioning from 0 to 1 (denoted as o->1). This specific combination allows for initialization of the burst sequence.

For Stage N+1, the configuration maintains the node ro at 0 and the node rob at 1. The node rst1 is set to 1, the node rstbi is set to 0, the node rst2 transitions from 1 to 0 (denoted as 1->0), and the node rstb2 is set to 1. In one or more implementations, this configuration creates the conditions for pulse generation in the burst mode.

All Other stages in the CMOS RO 400 maintain a consistent configuration with the node ro set to 0, the node rob set to 1, the node rst1 set to 0, the node rstb1 set to 1, the node rst2 set to 0, and the node rstb2 set 1. This uniform configuration for the remaining stages allows for pulse propagation through the CMOS RO 400.

Figure 7:
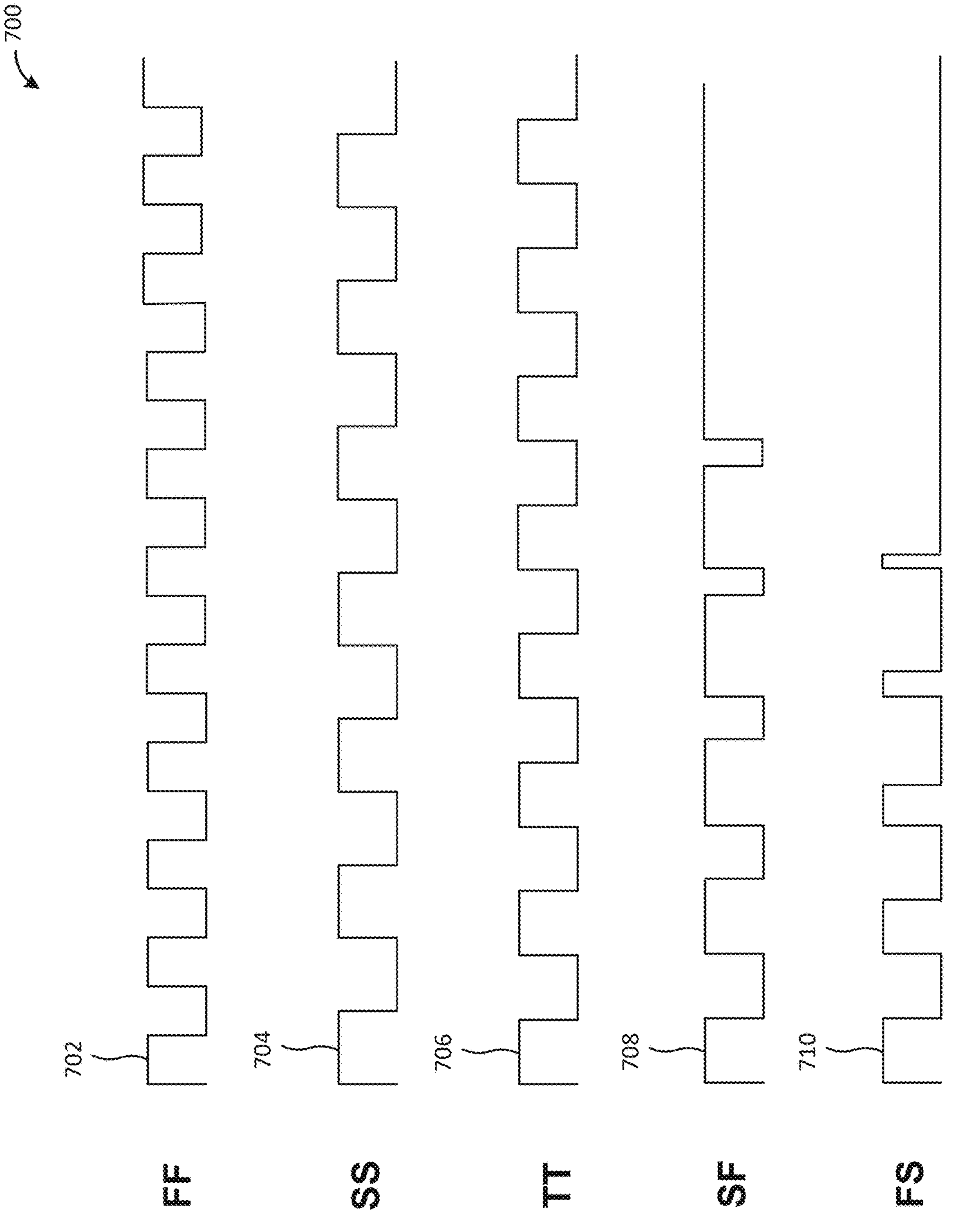
FIG. 7 illustrates a bit configuration table for a CMOS ring oscillator in burst mode, in accordance with some implementations.

FIG. 7 illustrates waveforms of the CMOS RO 400 (see FIG. 4) in the burst mode, in accordance with some implementations. The waveform 702 corresponds to the FF process corner. The waveform 702 shows consistent and equal-width pulses in a periodic pattern, indicative of balanced performance between NMOS and PMOS transistors in the FF process corner. In one or more implementations, the waveform 702 demonstrates robust oscillation with minimal degradation in pulse width.

The waveform 704 corresponds to the SS process corner. The waveform 704 exhibits similar characteristics as the waveform 702 but with a lower frequency, reflecting the slower transition times characteristic of the SS process corner. In one or more implementations, the waveform 704 demonstrates robust oscillation with minimal degradation in pulse width.

The waveform 706 corresponds to the TT process corner. The waveform 706 shows intermediate frequency behavior between the waveforms 702 and 704, representing the TT process corner operation. In one or more implementations, the waveform 706 demonstrates robust oscillation with minimal degradation in pulse width.

The waveform 708 corresponds to the SF process corner. The waveform 708 shows progressively decreasing pulse widths, eventually settling to a high state. This behavior indicates stronger PMOS performance relative to NMOS, causing gradual pulse width degradation during the burst sequence.

The waveform 710 corresponds to the FS process corner. The waveform 710 shows progressively decreasing pulse widths, eventually settling to a low state. This behavior indicates stronger NMOS performance relative to PMOS, causing gradual pulse width degradation during the burst sequence.

In some implementations, the balanced and skewed process corners may be distinguished by counting the number of pulses in a defined time window. In other implementations, the asymmetry between the final settled states of the waveform 708 and 710 allows for distinguishing between the skewed process corners SF and FS.

In some implementations when the process corner of the CMOS RO 400 is SS, FF, SF, or FS, the performance of the CMOS RO 400 may be brought to the typical performance by adjusting a supply voltage. In an implementation when the process corner of the CMOS RO 400 is SS, the performance of the CMOS RO 400 may be brought to the typical performance by increasing the supply voltage. In an implementation when the process corner of the CMOS RO 400 is FF, the performance of the CMOS RO 400 may be brought to the typical performance by decreasing the supply voltage.

Figure 8B:
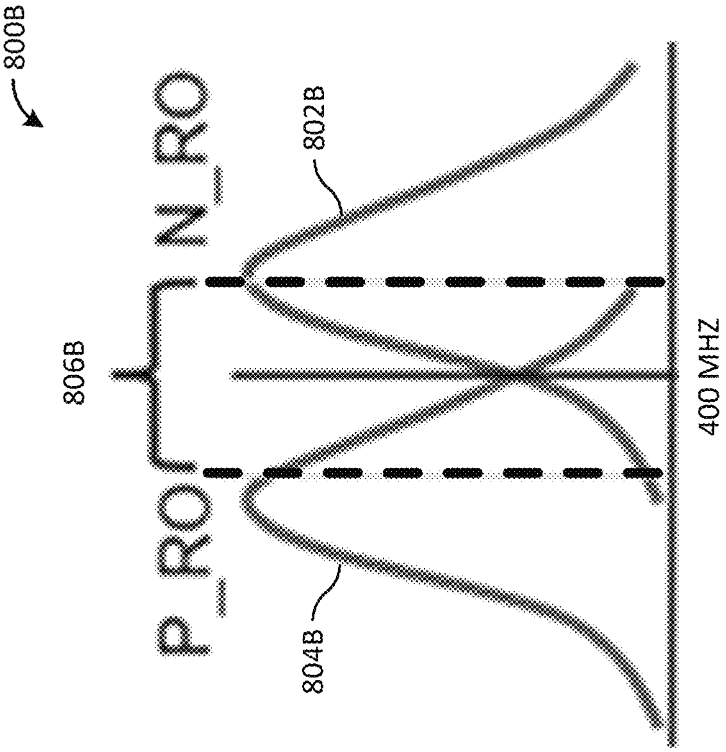
FIGS. 8A and 8B illustrate frequency distributions for NMOS and PMOS ring oscillators, in accordance with some implementations.
Figure 8A:
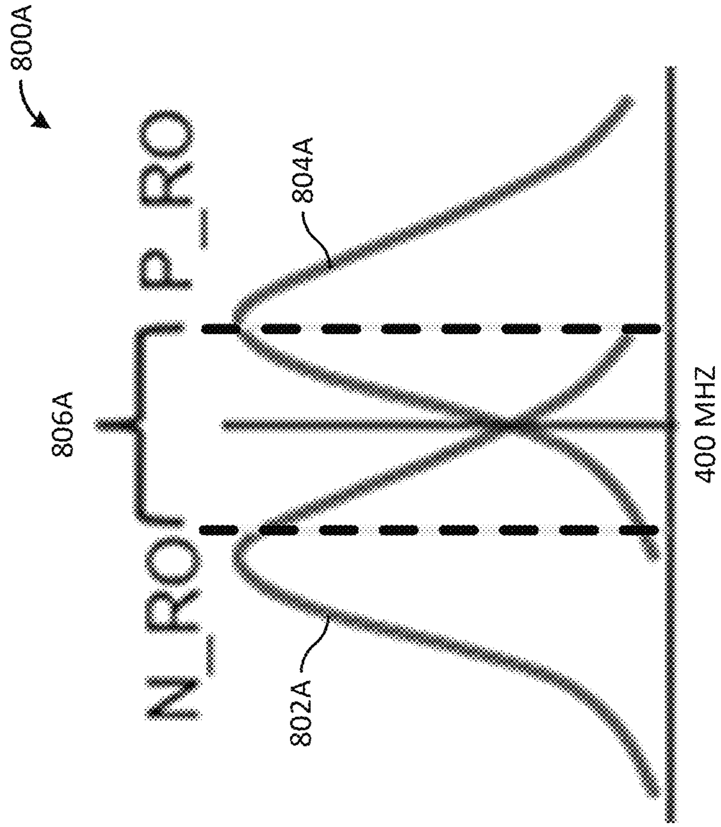

FIG. 8A illustrates frequency distributions for NMOS and PMOS ring oscillators, in accordance with some implementations. The curve 802A represents the NMOS RO frequency distribution and the curve 804A represents the PMOS RO frequency distribution. In the illustrated implementations, these distributions are separated by an exclusion zone 806A centered at 400 MHz.

In the illustrated implementation, the curve 802A for the NMOS RO appears on the left side of exclusion zone 806A while the curve 804A for the PMOS RO appears on the right side. In various implementations, when measured frequencies from both distributions (the curves 802A and 804A) remain within the exclusion zone 806A, this indicates a balanced process corner. When the measured frequencies are beyond the exclusion zone 806A, this suggests a skewed process corner where one transistor type exhibits different performance characteristics. In an implementation, the width of exclusion zone 806A may be selected to provide reliable separation between the curves 802A and 804A while maintaining measurement accuracy.

FIG. 8B illustrates frequency distributions for NMOS and PMOS ring oscillators, in accordance with some implementations. The curve 802B represents the NMOS RO frequency distribution and the curve 804B represents the PMOS RO frequency distribution. In the illustrated implementations, these distributions are separated by an exclusion zone 806B centered at 400 MHz.

In the illustrated implementation, the curve 802B for the NMOS RO appears on the right side of exclusion zone 806B while the curve 804B for the PMOS RO appears on the left side. In various implementations, when measured frequencies from both distributions (the curves 802B and 804B) remain within the exclusion zone 806B, this indicates a balanced process corner. When the measured frequencies are beyond the exclusion zone 806B, this suggests a skewed process corner where one transistor type exhibits different performance characteristics. In an implementation, the width of exclusion zone 806B may be selected to provide reliable separation between the curves 802A and 804A while maintaining measurement accuracy.

Figure 9A:
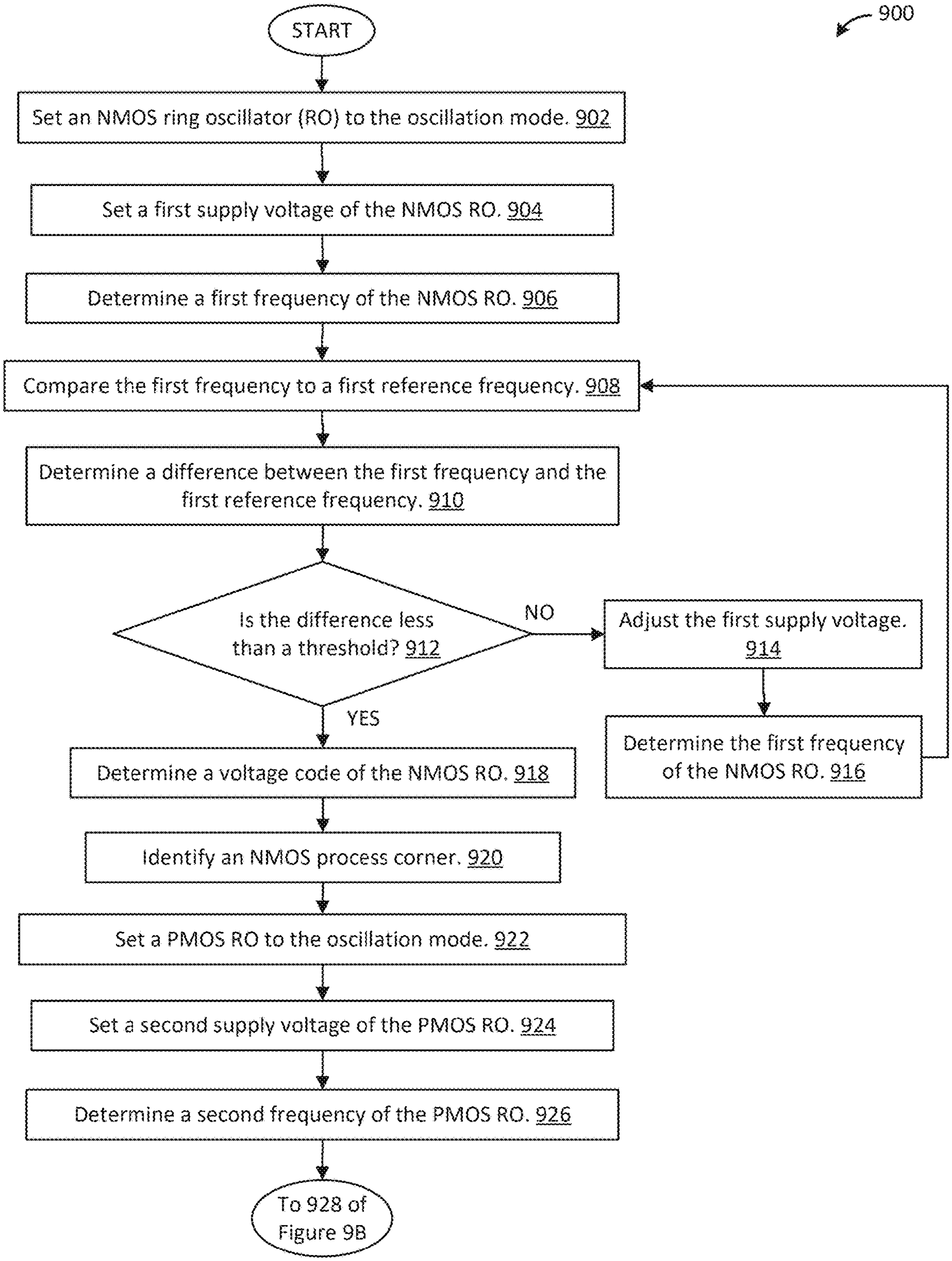
FIGS. 9A and 9B illustrate a flowchart of a method for operating adaptive voltage scaling system, in accordance with some implementations.
Figure 9B:
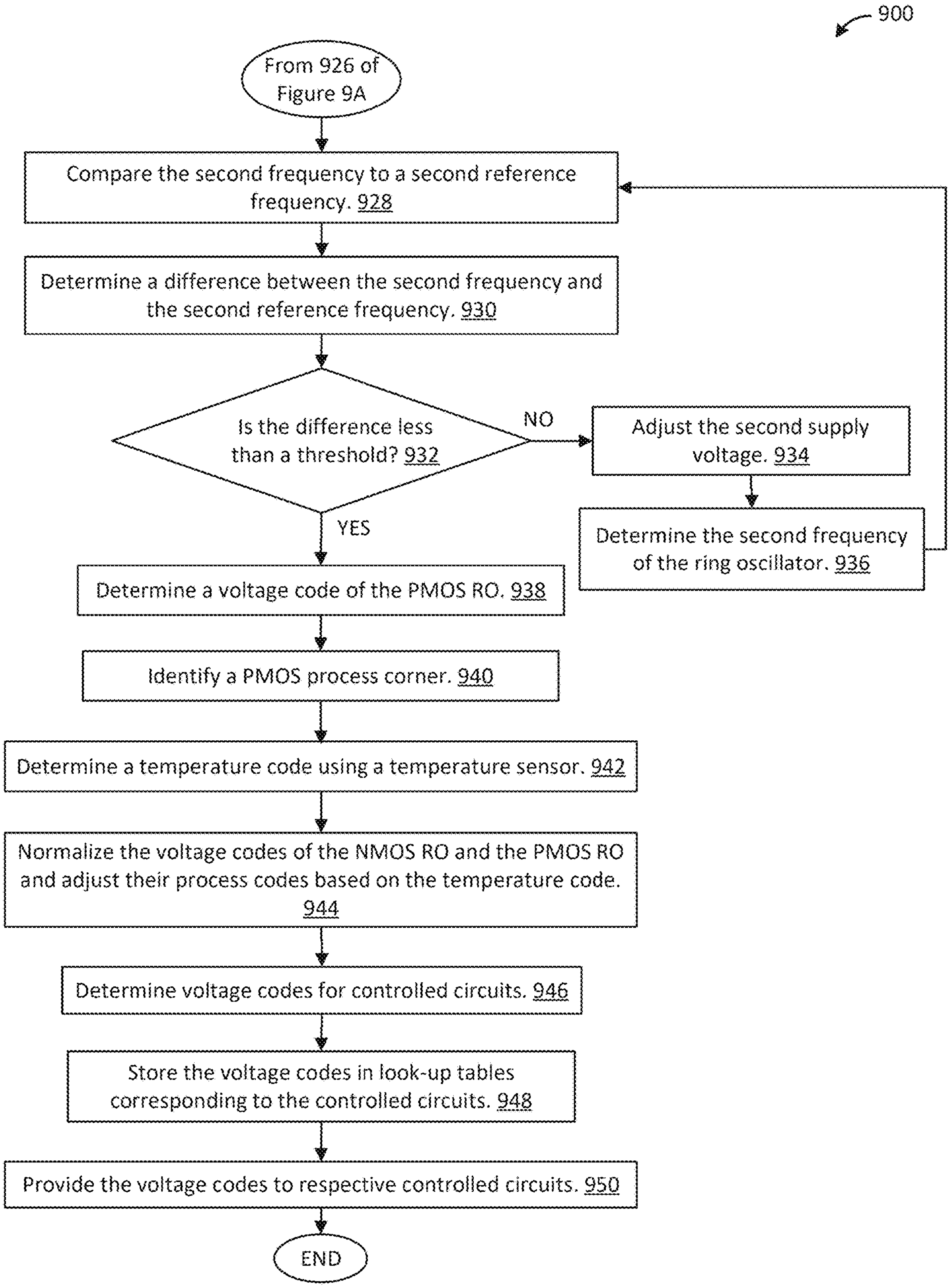

FIGS. 9A and 9B illustrate a flowchart of a method 900 for operating the adaptive voltage scaling system (e.g., AVS system 102 of FIG. 1), in accordance with some implementations. The method 900 is described in conjunction with FIGS. 1-3. The method 900 may be implemented, at least in part, in the form of executable code (e.g., instructions 130 of FIG. 1) stored on non-transitory, tangible, computer-readable medium (e.g., memory 128 of FIG. 1) that when executed by one or more processors (e.g., processor 140 of FIG. 1) may cause the one or more processors to perform one or more of the steps 902-950. Although shown in a particular sequence, it should be appreciated that the steps of method 900 may be performed in any suitable sequence.

The method 900 starts with step 902, when a processor (e.g., processor 140 of FIG. 1) of a controller (e.g., controller 126 of FIG. 1) of the AVS system (e.g., AVS system 102 of FIG. 1) sets an NMOS RO (e.g., NMOS RO 114 of FIG. 1) to the oscillation mode. In some implementations when the NMOS RO implemented by NMOS RO 200 of FIG. 2, the node pdb is set to 1. In step 904, a voltage regulator (e.g., voltage regulator 106 of FIG. 1) sets a first supply voltage of the NMOS RO (e.g., NMOS RO 114 of FIG. 1). In some implementations, the processor (e.g., processor 140 of FIG. 1) may send instructions to the voltage regulator (e.g., voltage regulator 106 of FIG. 1) to set the first supply voltage of the NMOS RO (e.g., NMOS RO 114 of FIG. 1).

In step 906, a first frequency of the NMOS RO (e.g., NMOS RO 114 of FIG. 1) is determined using a frequency counter circuit (e.g., frequency counter circuit 124 of FIG. 1). In step 908, the processor (e.g., processor 140 of FIG. 1) compares the first frequency to a first reference frequency. In step 910, the processor (e.g., processor 140 of FIG. 1) determines a difference between the first frequency and the first reference frequency. In step 912, the processor (e.g., processor 140 of FIG. 1) determines whether the difference is less than a threshold. In response to determining at step 912 that the difference is greater or equal to the threshold, the method 900 proceeds to step 914.

In step 914, the voltage regulator (e.g., voltage regulator 106 of FIG. 1) adjusts the first supply voltage of the NMOS RO (e.g., NMOS RO 114 of FIG. 1). In some implementations, the processor (e.g., processor 140 of FIG. 1) may send instructions to the voltage regulator (e.g., voltage regulator 106 of FIG. 1) to adjust the first supply voltage of the NMOS RO (e.g., NMOS RO 114 of FIG. 1). In step 916, the first frequency of the NMOS RO (e.g., NMOS RO 114 of FIG. 1) is determined again using the frequency counter circuit (e.g., frequency counter circuit 124 of FIG. 1). After step 916, the method 900 proceeds back to step 908. In some implementations, steps 908-916 may be repeated one or more times until the difference is less than the threshold.

In response to determining at step 912 that the difference is less than the threshold, the method 900 proceeds to step 918. In step 918, the processor (e.g., processor 140 of FIG. 1) determines a voltage code of the NMOS RO (e.g., NMOS RO 114 of FIG. 1). The voltage code corresponds to the first supply voltage of the NMOS RO (e.g., NMOS RO 114 of FIG. 1) such that the difference between the first frequency and the reference frequency is less than the threshold.

A mapping between the voltage code and the supply voltage depends on characteristics of the voltage regulator (e.g., voltage regulator 106 of FIG. 1). In some implementations, high voltage code corresponds to high supply voltage and low voltage code corresponds to low supply voltage. In other implementations, high voltage code corresponds to low supply voltage and low voltage code corresponds to high supply voltage.

In step 920, the processor (e.g., processor 140 of FIG. 1) identifies an NMOS process corner based on the determined voltage code. In some implementations, the processor (e.g., processor 140 of FIG. 1) compares the determined voltage code to a reference voltage code. In some implementations when high voltage code corresponds to high supply voltage and low voltage code corresponds to low supply voltage, if the voltage code is higher than the reference voltage code, the NMOS RO (e.g., NMOS RO 114 of FIG. 1) needs a higher supply voltage to oscillate at the reference frequency, so the processor (e.g., processor 140 of FIG. 1) identifies the NMOS process as slow (S). If the voltage code is close or equal to the reference voltage code, the NMOS RO (e.g., NMOS RO 114 of FIG. 1) needs a typical supply voltage to oscillate at the reference frequency, so the processor (e.g., processor 140 of FIG. 1) identifies the NMOS process as typical (T). If the voltage code is lower than the reference voltage code, the NMOS RO (e.g., NMOS RO 114 of FIG. 1) needs a lower supply to oscillate at the reference frequency, so the processor (e.g., processor 140 of FIG. 1) identifies the NMOS process as fast (F).

In other implementations when high voltage code corresponds to low supply voltage and low voltage code corresponds to high supply voltage, if the voltage code is lower than the reference voltage code, the NMOS RO (e.g., NMOS RO 114 of FIG. 1) needs a higher supply voltage to oscillate at the reference frequency, so the processor (e.g., processor 140 of FIG. 1) identifies the NMOS process as slow (S). If the voltage code is close or equal to the reference voltage code, the NMOS RO (e.g., NMOS RO 114 of FIG. 1) needs a typical supply voltage to oscillate at the reference frequency, so the processor (e.g., processor 140 of FIG. 1) identifies the NMOS process as typical (T). If the voltage code is higher than the reference voltage code, the NMOS RO (e.g., NMOS RO 114 of FIG. 1) needs a lower supply to oscillate at the reference frequency, so the processor (e.g., processor 140 of FIG. 1) identifies the NMOS process as fast (F).

There can be multiple fast or slow process corners with finer process binning based on the voltage code and the temperature code. For example, for slow process corners, there can be a 1σ slow process corner (S-1σ), a 2σ slow process corner (S-2σ), and a 3σ slow process corner (S-3σ). For fast process corners, there can be a 1σ fast process corner (F-1σ), a 2σ fast process corner (F-2σ), and a 3σ fast process corner (F-3σ).

In step 922, the processor (e.g., processor 140 of FIG. 1) sets a PMOS RO (e.g., PMOS RO 116 of FIG. 1) to the oscillation mode. In some implementations when the PMOS RO implemented by PMOS RO 300 of FIG. 3, the node pd is set to 0. In step 924, the voltage regulator (e.g., voltage regulator 106 of FIG. 1) sets a second supply voltage of the PMOS RO (e.g., PMOS RO 116 of FIG. 1). In some implementations, the processor (e.g., processor 140 of FIG. 1) may send instructions to the voltage regulator (e.g., voltage regulator 106 of FIG. 1) to set the second supply voltage of the PMOS RO (e.g., PMOS RO 116 of FIG. 1). In step 926, a second frequency of the PMOS RO (e.g., PMOS RO 116 of FIG. 1) is determined using the frequency counter circuit (e.g., frequency counter circuit 124 of FIG. 1). In step 928, the processor (e.g., processor 140 of FIG. 1) compares the second frequency to a second reference frequency.

In step 930, the processor (e.g., processor 140 of FIG. 1) determines a difference between the second frequency and the second reference frequency. In step 932, the processor (e.g., processor 140 of FIG. 1) determines whether the difference is less than a threshold. In response to determining at step 932 that the difference is greater or equal to the threshold, the method 900 proceeds to step 934. In step 934, the voltage regulator (e.g., voltage regulator 106 of FIG. 1) adjusts the second supply voltage of the PMOS RO (e.g., PMOS RO 116 of FIG. 1). In some implementations, the processor (e.g., processor 140 of FIG. 1) may send instructions to the voltage regulator (e.g., voltage regulator 106 of FIG. 1) to adjust the second supply voltage of the PMOS RO (e.g., PMOS RO 116 of FIG. 1). In step 936, the second frequency of the PMOS RO (e.g., PMOS RO 116 of FIG. 1) is determined again using the frequency counter circuit (e.g., frequency counter circuit 124 of FIG. 1). After step 936, the method 900 proceeds back to step 928. In some implementations, steps 928-936 may be repeated one or more times until the difference is less than the threshold.

In response to determining at step 932 that the difference is less than the threshold, the method 900 proceeds to step 938. In step 938, the processor (e.g., processor 140 of FIG. 1) determines a voltage code of the PMOS RO (e.g., PMOS RO 116 of FIG. 1). The voltage code corresponds to the second supply voltage of the PMOS RO (e.g., PMOS RO 116 of FIG. 1) such that the difference between the second frequency and the reference frequency is less than the threshold.

A mapping between the voltage code and the supply voltage depends on characteristics of the voltage regulator (e.g., voltage regulator 106 of FIG. 1). In some implementations, high voltage code corresponds to high supply voltage and low voltage code corresponds to low supply voltage. In other implementations, high voltage code corresponds to low supply voltage and low voltage code corresponds to high supply voltage.

In step 940, the processor (e.g., processor 140 of FIG. 1) identifies a PMOS process corner based on the determined voltage code. In some implementations, the processor (e.g., processor 140 of FIG. 1) compares the determined voltage code to a reference voltage code. In some implementations when high voltage code corresponds to high supply voltage and low voltage code corresponds to low supply voltage, if the voltage code is higher than the reference voltage code, the PMOS RO (e.g., PMOS RO 116 of FIG. 1) needs a higher supply voltage to oscillate at the reference frequency, so the processor (e.g., processor 140 of FIG. 1) identifies the PMOS process as slow(S). If the voltage code is close or equal to the reference voltage code, the PMOS RO (e.g., PMOS RO 116 of FIG. 1) needs a typical supply voltage to oscillate at the reference frequency, so the processor (e.g., processor 140 of FIG. 1) identifies the PMOS process as typical (T). If the voltage code is lower than the reference voltage code, the PMOS RO (e.g., PMOS RO 116 of FIG. 1) needs a lower supply to oscillate at the reference frequency, so the processor (e.g., processor 140 of FIG. 1) identifies the PMOS process as fast (F).

In other implementations when high voltage code corresponds to low supply voltage and low voltage code corresponds to high supply voltage, if the voltage code is lower than the reference voltage code, the PMOS RO (e.g., PMOS RO 116 of FIG. 1) needs a higher supply voltage to oscillate at the reference frequency, so the processor (e.g., processor 140 of FIG. 1) identifies the PMOS process as slow(S). If the voltage code is close or equal to the reference voltage code, the PMOS RO (e.g., PMOS RO 116 of FIG. 1) needs a typical supply voltage to oscillate at the reference frequency, so the processor (e.g., processor 140 of FIG. 1) identifies the PMOS process as typical (T). If the voltage code is higher than the reference voltage code, the PMOS RO (e.g., PMOS RO 116 of FIG. 1) needs a lower supply to oscillate at the reference frequency, so the processor (e.g., processor 140 of FIG. 1) identifies the PMOS process as fast (F).

There can be multiple fast or slow process corners with finer process binning based on the voltage code and the temperature code. For example, for slow process corners, there can be a 1σ slow process corner (S-1σ), a 2σ slow process corner (S-2σ), and a 3σ slow process corner (S-3σ). For fast process corners, there can be a 1σ fast process corner (F-1σ), a 2σ fast process corner (F-2σ), and a 3σ fast process corner (F-3σ).

In step 942, a temperature sensor (e.g., temperature sensor 122 of FIG. 1) determines a temperature code that corresponds to a temperature of a die. In step 944, the processor (e.g., processor 140 of FIG. 1) normalizes and adjusts the voltage codes of the NMOS RO (e.g., NMOS RO 114 of FIG. 1) and the PMOS RO (e.g., PMOS RO 116 of FIG. 1) based on the temperature code. In some implementations, the NMOS RO (e.g., NMOS RO 114 of FIG. 1) and the PMOS RO (e.g., PMOS RO 116 of FIG. 1) can have different temperature sensitivity.

In an implementation, the PMOS RO (e.g., PMOS RO 116 of FIG. 1) is faster at high temperatures. Therefore, at high temperatures, the PMOS RO (e.g., PMOS RO 116 of FIG. 1) needs a lower supply voltage to oscillate at a fixed frequency. As a result, a high temperature code means a slower PMOS process and a lower temperature code means a faster PMOS process. In an implementation, the NMOS RO (e.g., NMOS RO 114 of FIG. 1) is temperature insensitive, such that the temperature code has almost no impact on the process decoding.

In some implementations, the adjusted voltage codes may be determined based on the equation $Vreg_{code}=temp_{gradient}*Temp+Vreg_{code\ offset}$, where $Vreg_{code}$ is the voltage code determined in 918 or 938, $temp_{gradient}$ is a temperature gradient, Temp is the temperature determined by the temperature sensor (e.g., temperature sensor 122 of FIG. 1), and $Vreg_{code\ offset}$ is the adjusted voltage code normalized to a certain temperature, for example, 0° C. Based on the normalized $Vreg_{code\ offset}$, the NMOS and PMOS process codes will be adjusted, eliminating the temperature interferences on process corner identification. In some implementations, the NMOS RO (e.g., NMOS RO 114 of FIG. 1) and the PMOS RO (e.g., PMOS RO 116 of FIG. 1) have different $temp_{gradient}$. In an implementation, $temp_{gradient}$ of the NMOS RO (e.g., NMOS RO 114 of FIG. 1) is approximately zero, which indicates temperature insensitivity of the NMOS RO (e.g., NMOS RO 114 of FIG. 1).

In implementations when the temperature tracking is turned on in the method 900, the processor (e.g., processor 140 of FIG. 1) will use $Vreg_{code}$ to determine the voltage codes for the controlled circuits (e.g., circuits 146, 150, and 154 of FIG. 1). In implementations when the temperature tracking is turned off in the method 900, the processer (e.g., processor 140 of FIG. 1) will use $Vreg_{code\ offset}$, to determine the voltage codes for the controlled circuits (e.g., circuits 146, 150, and 154 of FIG. 1), which leads to a higher supply voltage for temperature variation tolerance. In some implementations, transistors operate slowest at low temperatures and requires higher voltage, so the $Vreg_{code\ offset}$ can be normalized to the lowest temperature, for example, 0° C.

In step 946, the processor (e.g., processor 140 of FIG. 1) determines voltage codes (e.g., vreg_rx<5:0>, vreg_tx<5:0>, vreg_pll<5:0> of FIG. 1) for controlled circuits (e.g., circuits 146, 150, and 154 of FIG. 1) based on the determined voltage codes of the NMOS RO (e.g., NMOS RO 114 of FIG. 1) and the PMOS RO (e.g., PMOS RO 116 of FIG. 1). In step 948, the processor (e.g., processor 140 of FIG. 1) stores the voltage codes (e.g., vreg_rx<5:0>, vreg_tx<5:0>, vreg_pll<5:0> of FIG. 1) in look-up tables (e.g., RX LUT 134, TX LUT 136, and PLL LUT 138 of FIG. 1) that correspond to the controlled circuits (e.g., circuits 146, 150, and 154 of FIG. 1). In step 950, the processor (e.g., processor 140 of FIG. 1) provides the voltage codes (e.g., vreg_rx<5:0>, vreg_tx<5:0>, vreg_pll<5:0> of FIG. 1) to respective controlled circuits (e.g., circuits 146, 150, and 154 of FIG. 1) through voltage regulators (e.g., voltage regulators 148, 152, and 156 of FIG. 1). In some implementations, the processor (e.g., processor 140 of FIG. 1) retrieves the voltage codes (e.g., vreg_rx<5:0>, vreg_tx<5:0>, vreg_pll<5:0> of FIG. 1) from the look-up tables (e.g., RX LUT 134, TX LUT 136, and PLL LUT 138 of FIG. 1) and sends the retrieved voltage codes (e.g., vreg_rx<5:0>, vreg_tx<5:0>, vreg_pll<5:0> of FIG. 1) to respective controlled circuits (e.g., circuits 146, 150, and 154 of FIG. 1). After step 950, the method 900 ends.

The method 900 allows for iteratively adjusting supply voltages until both NMOS and PMOS ring oscillators achieve their target frequencies (e.g., typical frequencies) within specified thresholds. In an implementation when a controlled circuit comprises predominantly of NMOS transistors, steps 920-936 of the method 900 may be omitted. In another implementation when a controlled circuit comprises predominantly of PMOS transistors, steps 902-918 of the method 900 may be omitted.

Figure 10:
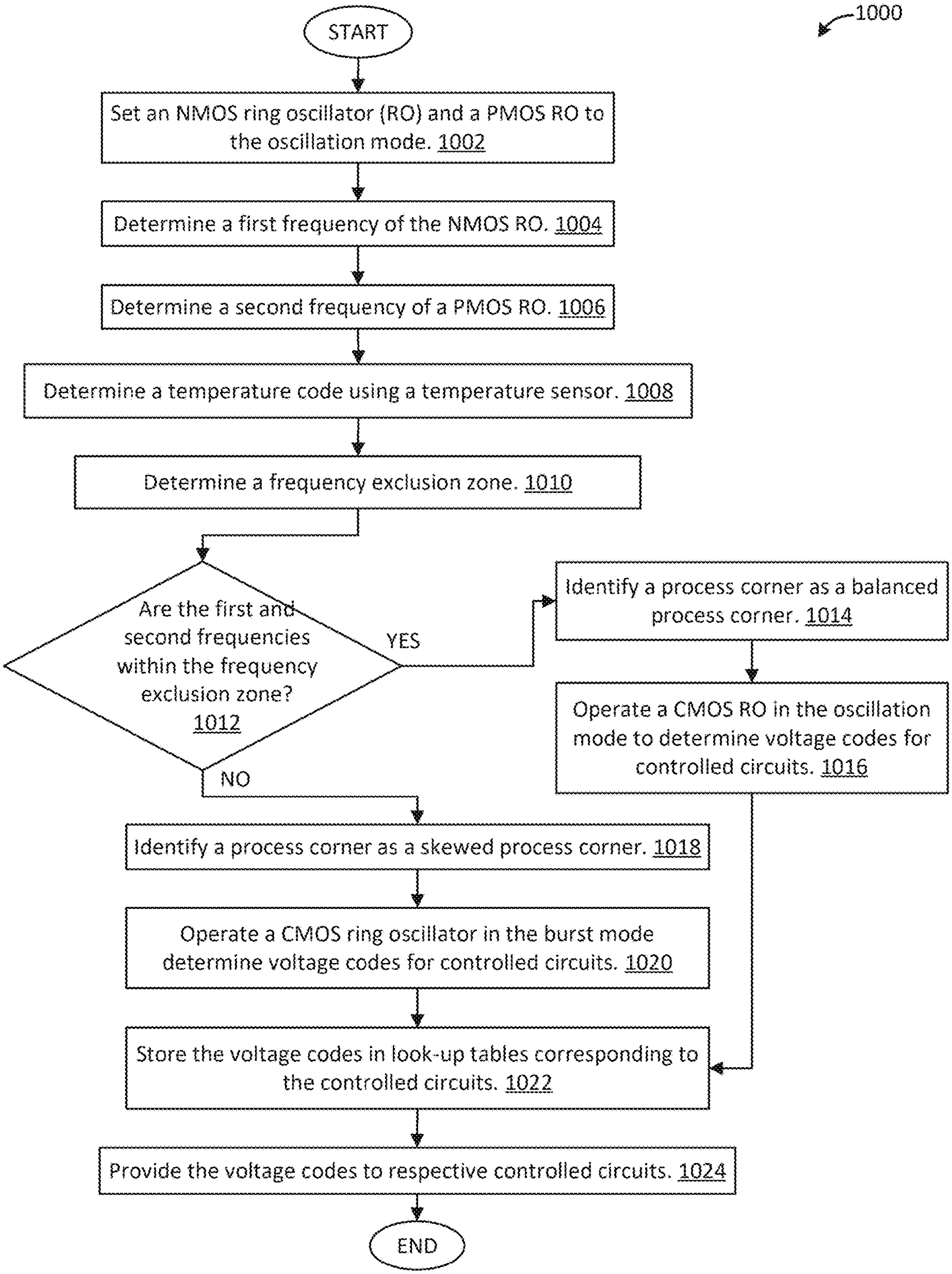
FIG. 10 illustrates a flowchart of a method for operating adaptive voltage scaling system, in accordance with some implementations.

FIG. 10 illustrates a flowchart of a method 1000 for operating the adaptive voltage scaling system (e.g., AVS system 102 of FIG. 1), in accordance with some implementations. The method 1000 is described in conjunction with FIGS. 1-7, 8A, and 8B. The method 1000 may be implemented, at least in part, in the form of executable code (e.g., instructions 130 of FIG. 1) stored on non-transitory, tangible, computer-readable medium (e.g., memory 128 of FIG. 1) that when executed by one or more processors (e.g., processor 140 of FIG. 1) may cause the one or more processors to perform one or more of the steps 1002-1024. Although shown in a particular sequence, it should be appreciated that the steps of method 1000 may be performed in any suitable sequence.

The method 1000 starts with step 1002, when a processor (e.g., processor 140 of FIG. 1) of a controller (e.g., controller 126 of FIG. 1) of the AVS system (e.g., AVS system 102 of FIG. 1) sets an NMOS RO (e.g., NMOS RO 114 of FIG. 1) and a PMOS RO (e.g., PMOS RO 116 of FIG. 1) to the oscillation mode. In some implementations when the NMOS RO implemented by NMOS RO 200 of FIG. 2, the node pdb is set to 1. In some implementations when the PMOS RO implemented by PMOS RO 300 of FIG. 3, the node pd is set to 0.

In step 1004, a first frequency of the NMOS RO (e.g., NMOS RO 114 of FIG. 1) is determined using a frequency counter circuit (e.g., frequency counter circuit 124 of FIG. 1). In step 1006, a second frequency of the PMOS RO (e.g., PMOS RO 116 of FIG. 1) is determined using the frequency counter circuit (e.g., frequency counter circuit 124 of FIG. 1). In step 1008, a temperature sensor (e.g., temperature sensor 122 of FIG. 1) determines a temperature code that corresponds to a temperature of a die. In step 1010, the processor (e.g., processor 140 of FIG. 1) determines a frequency exclusion zone based on the temperature code. In step 1012, the processor (e.g., processor 140 of FIG. 1) determines whether the first frequency and the second frequency are within the frequency exclusion zone (e.g., exclusion zones 806A and 806B of FIGS. 8A and 8B).

In response to determining at step 1012 that the first frequency and the second frequency are within the frequency exclusion zone (e.g., exclusion zones 806A and 806B of FIGS. 8A and 8B), the method 1000 proceeds to step 1014. In step 1014, the processor (e.g., processor 140 of FIG. 1) identifies a process corner as a balanced process corner. In step 1016, the processor (e.g., processor 140 of FIG. 1) operates a CMOS RO (e.g., CMOS RO 118 of FIG. 1) in the oscillation mode to determine voltage codes (e.g., vreg_rx<5:0>, vreg_tx<5:0>, vreg_pll<5:0> of FIG. 1) for controlled circuits (e.g., circuits 146, 150, and 154 of FIG. 1). In some implementations, the step 1012 may be performed according to a method 1100 described below with reference to FIG. 11. After step 1016, the method 1000 proceeds to step 1022.

In response to determining at step 1012 that the first frequency and the second frequency are not within the frequency exclusion zone (e.g., exclusion zones 806A and 806B of FIGS. 8A and 8B), the method 1000 proceeds to step 1018. In step 1018, the processor (e.g., processor 140 of FIG. 1) identifies a process corner as a skewed process corner. In step 1020, the processor (e.g., processor 140 of FIG. 1) operates the CMOS RO (e.g., CMOS RO 118 of FIG. 1) in the burst mode to determine voltage codes (e.g., vreg_rx<5:0>, vreg_tx<5:0>, vreg_pll<5:0> of FIG. 1) for controlled circuits (e.g., circuits 146, 150, and 154 of FIG. 1). In some implementations, the step 1020 may be performed according to a method 1200 described below with reference to FIG. 12.

After steps 1016 or 1020, the method 1000 proceeds to step 1022. In step 1022, the processor (e.g., processor 140 of FIG. 1) stores the voltage codes (e.g., vreg_rx<5:0>, vreg_tx<5:0>, vreg_pll<5:0> of FIG. 1) in look-up tables (e.g., RX LUT 134, TX LUT 136, and PLL LUT 138 of FIG. 1) that correspond to the controlled circuits (e.g., circuits 146, 150, and 154 of FIG. 1). In step 1024, the processor (e.g., processor 140 of FIG. 1) provides the voltage codes (e.g., vreg_rx<5:0>, vreg_tx<5:0>, vreg_pll<5:0> of FIG. 1) to respective controlled circuits (e.g., circuits 146, 150, and 154 of FIG. 1) through voltage regulators (e.g., voltage regulators 148, 152, and 156 of FIG. 1). In some implementations, the processor (e.g., processor 140 of FIG. 1) retrieves the voltage codes (e.g., vreg_rx<5:0>, vreg_tx<5:0>, vreg_pll<5:0> of FIG. 1) from the look-up tables (e.g., RX LUT 134, TX LUT 136, and PLL LUT 138 of FIG. 1) and sends the retrieved voltage codes (e.g., vreg_rx<5:0>, vreg_tx<5:0>, vreg_pll<5:0> of FIG. 1) to respective controlled circuits (e.g., circuits 146, 150, and 154 of FIG. 1). After step 1024, the method 1000 ends.

Figure 11:
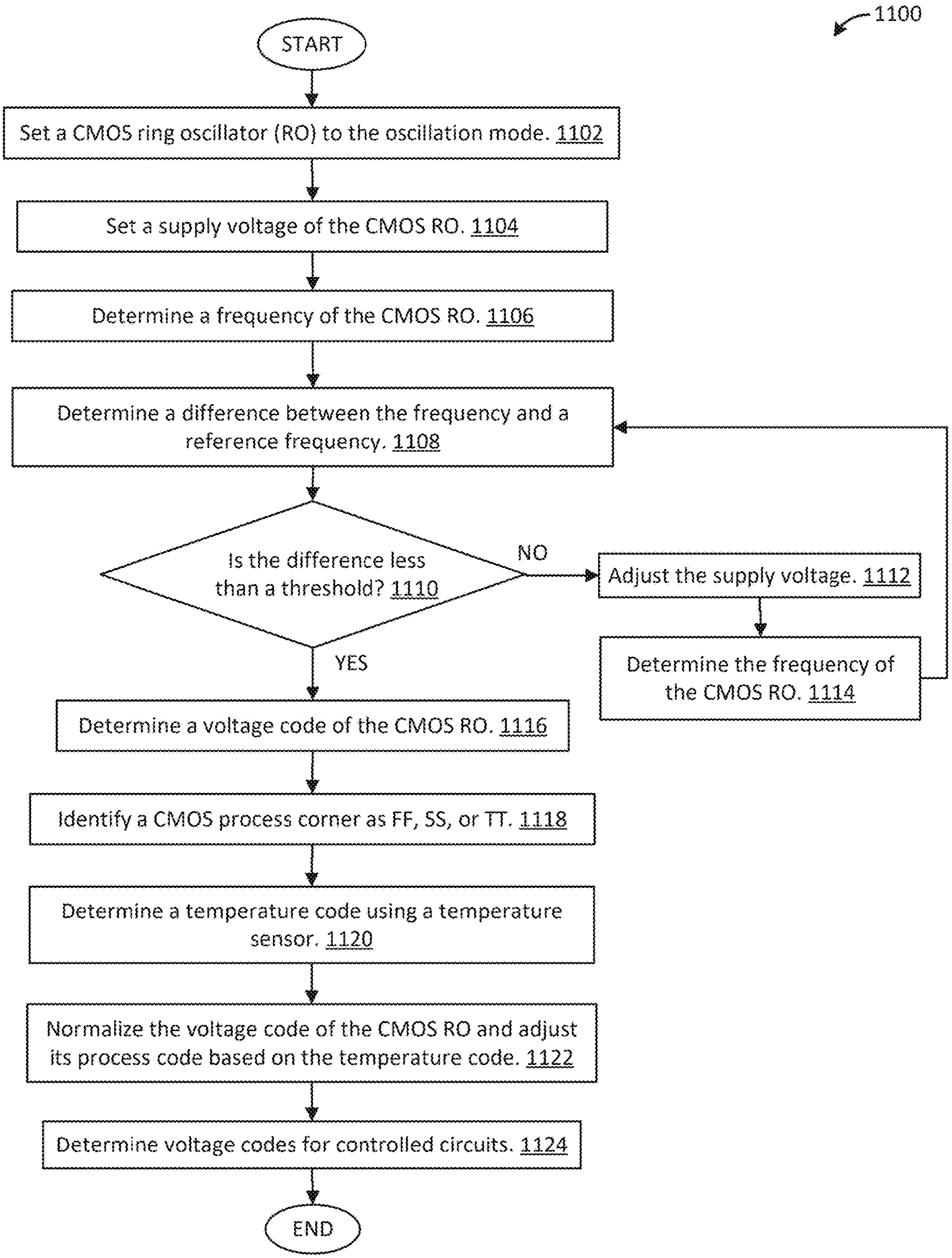
FIG. 11 illustrates a flowchart of a method for operating adaptive voltage scaling system, in accordance with some implementations.

FIG. 11 illustrates a flowchart of a method 1100 for operating the adaptive voltage scaling system (e.g., AVS system 102 of FIG. 1), in accordance with some implementations. The method 1100 is described in conjunction with FIGS. 1-7. The method 1100 may be implemented, at least in part, in the form of executable code (e.g., instructions 130 of FIG. 1) stored on non-transitory, tangible, computer-readable medium (e.g., memory 128 of FIG. 1) that when executed by one or more processors (e.g., processor 140 of FIG. 1) may cause the one or more processors to perform one or more of the steps 1102-1124. Although shown in a particular sequence, it should be appreciated that the steps of method 1100 may be performed in any suitable sequence.

The method 1100 starts with step 1102, when a processor (e.g., processor 140 of FIG. 1) of a controller (e.g., controller 126 of FIG. 1) of the AVS system (e.g., AVS system 102 of FIG. 1) sets a CMOS RO (e.g., CMOS RO 118 of FIG. 1) to the oscillation mode. In some implementations when the CMOS RO is implemented by CMOS RO 400 of FIG. 4, the oscillation mode is set by setting the control signals according to the table 500 of FIG. 5. In step 1104, a voltage regulator (e.g., voltage regulator 106 of FIG. 1) sets a supply voltage of the CMOS RO (e.g., CMOS RO 118 of FIG. 1). In some implementations, the processor (e.g., processor 140 of FIG. 1) may send instructions to the voltage regulator (e.g., voltage regulator 106 of FIG. 1) to set the supply voltage of the CMOS RO (e.g., CMOS RO 118 of FIG. 1).

In step 1106, a frequency of the CMOS RO (e.g., CMOS RO 118 of FIG. 1) is determined using a frequency counter circuit (e.g., frequency counter circuit 124 of FIG. 1). In step 1108, the processor (e.g., processor 140 of FIG. 1) determines a difference between the frequency and a reference frequency. In step 1110, the processor (e.g., processor 140 of FIG. 1) determines whether the difference is less than a threshold.

In response to determining at step 1110 that the difference is greater or equal to the threshold, the method 1100 proceeds to step 1112. In step 1112, the voltage regulator (e.g., voltage regulator 106 of FIG. 1) adjusts the supply voltage of the CMOS RO (e.g., CMOS RO 118 of FIG. 1). In some implementations, the processor (e.g., processor 140 of FIG. 1) may send instructions to the voltage regulator (e.g., voltage regulator 106 of FIG. 1) to adjust the supply voltage of the CMOS RO (e.g., CMOS RO 118 of FIG. 1). In step 1114, the frequency of the CMOS RO (e.g., CMOS RO 118 of FIG. 1) is determined again using the frequency counter circuit (e.g., frequency counter circuit 124 of FIG. 1). After step 1114, the method 1100 proceeds back to step 1108. In some implementations, steps 1108-1114 may be repeated one or more times until the difference is less than the threshold.

In response to determining at step 1110 that the difference is less than the threshold, the method 1100 proceeds to step 1116. In step 1116, the processor (e.g., processor 140 of FIG. 1) determines a voltage code of the CMOS RO (e.g., CMOS RO 118 of FIG. 1). The voltage code corresponds to the supply voltage of the CMOS RO (e.g., CMOS RO 118 of FIG. 1) such that the difference between the frequency and the reference frequency is less than the threshold.

In step 1118, the processor (e.g., processor 140 of FIG. 1) identifies a CMOS process corner as FF, SS, or TT. In some implementations, the processor (e.g., processor 140 of FIG. 1) compares the determined voltage code to a reference voltage code. In some implementations when high voltage code corresponds to high supply voltage and low voltage code corresponds to low supply voltage, if the voltage code is higher than the reference voltage code, the CMOS RO (e.g., CMOS RO 118 of FIG. 1) needs a higher supply voltage to oscillate at the reference frequency, so the processor (e.g., processor 140 of FIG. 1) identifies the CMOS process as SS. If the voltage code is close or equal to the reference voltage code, the CMOS RO (e.g., CMOS RO 118 of FIG. 1) needs a typical supply voltage to oscillate at the reference frequency, so the processor (e.g., processor 140 of FIG. 1) identifies the CMOS process as TT. If the voltage code is lower than the reference voltage code, the CMOS RO (e.g., CMOS RO 118 of FIG. 1) needs a lower supply to oscillate at the reference frequency, so the processor (e.g., processor 140 of FIG. 1) identifies the CMOS process as FF.

In other implementations when high voltage code corresponds to low supply voltage and low voltage code corresponds to high supply voltage, if the voltage code is lower than the reference voltage code, the CMOS RO (e.g., CMOS RO 118 of FIG. 1) needs a higher supply voltage to oscillate at the reference frequency, so the processor (e.g., processor 140 of FIG. 1) identifies the CMOS process as SS. If the voltage code is close or equal to the reference voltage code, the CMOS RO (e.g., CMOS RO 118 of FIG. 1) needs a typical supply voltage to oscillate at the reference frequency, so the processor (e.g., processor 140 of FIG. 1) identifies the CMOS process as TT. If the voltage code is higher than the reference voltage code, the CMOS RO (e.g., CMOS RO 118 of FIG. 1) needs a lower supply to oscillate at the reference frequency, so the processor (e.g., processor 140 of FIG. 1) identifies the CMOS process as FF.

In step 1120, a temperature sensor (e.g., temperature sensor 122 of FIG. 1) determines a temperature code that corresponds to a temperature of a die. In step 1122, the processor (e.g., processor 140 of FIG. 1) normalizes and adjusts the voltage code of the CMOS RO (e.g., CMOS RO 118 of FIG. 1) based on the temperature code. In an implementation, the CMOS RO tends to oscillate slower at higher temperatures with a fixed supply. Therefore, if the temperature code is high, the process will be decoded as a faster process corner, and if the temperature code is low, the process will be decoded as a slower process corner.

In some implementations, the adjusted voltage code may be determined based on the equation $Vreg_{code}=temp_{gradient}*Temp+Vreg_{code\ offset}$, where $Vreg_{code}$ is the voltage code determined in step 1116, $temp_{gradient}$ is a temperature gradient, Temp is the temperature determined by the temperature sensor (e.g., temperature sensor 122 of FIG. 1), and $Vreg_{code\ offset}$ is the adjusted voltage code normalized to a certain temperature, for example, at 0° C. Based on the normalized $Vreg_{code\ offset}$, the CMOS process code will be adjusted, eliminating the temperature interferences on process corner identification.

In implementations when the temperature tracking is turned on in the method 1100, the processor (e.g., processor 140 of FIG. 1) will use $Vreg_{code}$ to determine the voltage codes for the controlled circuits (e.g., circuits 146, 150, and 154 of FIG. 1). In implementations when the temperature tracking is turned off in the method 1100, the processer (e.g., processor 140 of FIG. 1) will use $Vreg_{code\ offset}$, to determine the voltage codes for the controlled circuits (e.g., circuits 146, 150, and 154 of FIG. 1), which leads to a higher supply voltage for temperature variation tolerance. In some implementations, transistors operate slowest at low temperatures and requires higher voltage, so the $Vreg_{code\ offset}$ can be normalized to the lowest temperature, for example, 0° C.

In step 1124, the processor (e.g., processor 140 of FIG. 1) determines voltage codes (e.g., vreg_rx<5:0>, vreg_tx<5:0>, vreg_pll<5:0> of FIG. 1) for controlled circuits (e.g., circuits 146, 150, and 154 of FIG. 1) based the determined voltage code. After step 1124, the method 1100 ends.

Figure 12A:
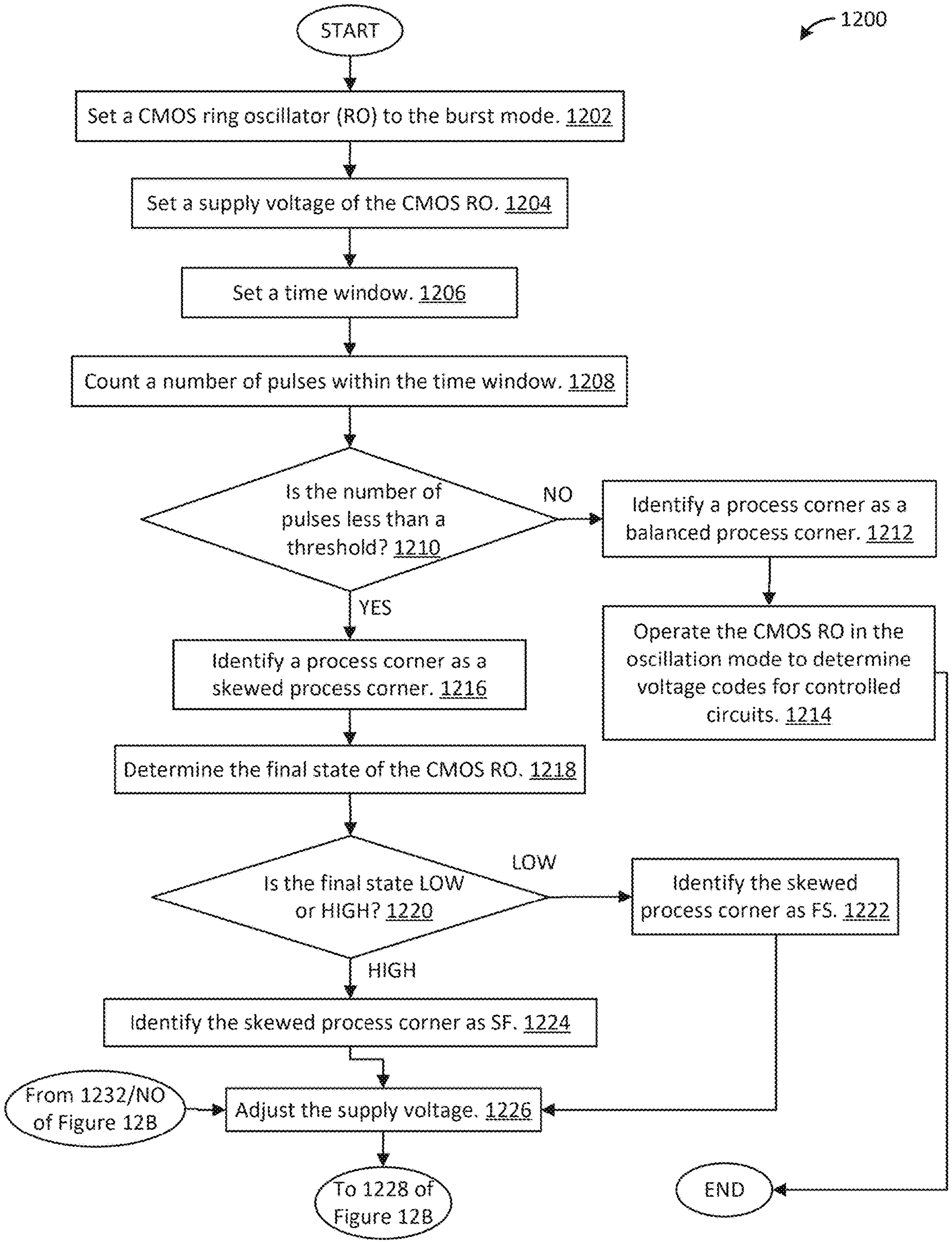
FIGS. 12A and 12B illustrate a flowchart of a method for operating adaptive voltage scaling system, in accordance with some implementations.
Figure 12B:
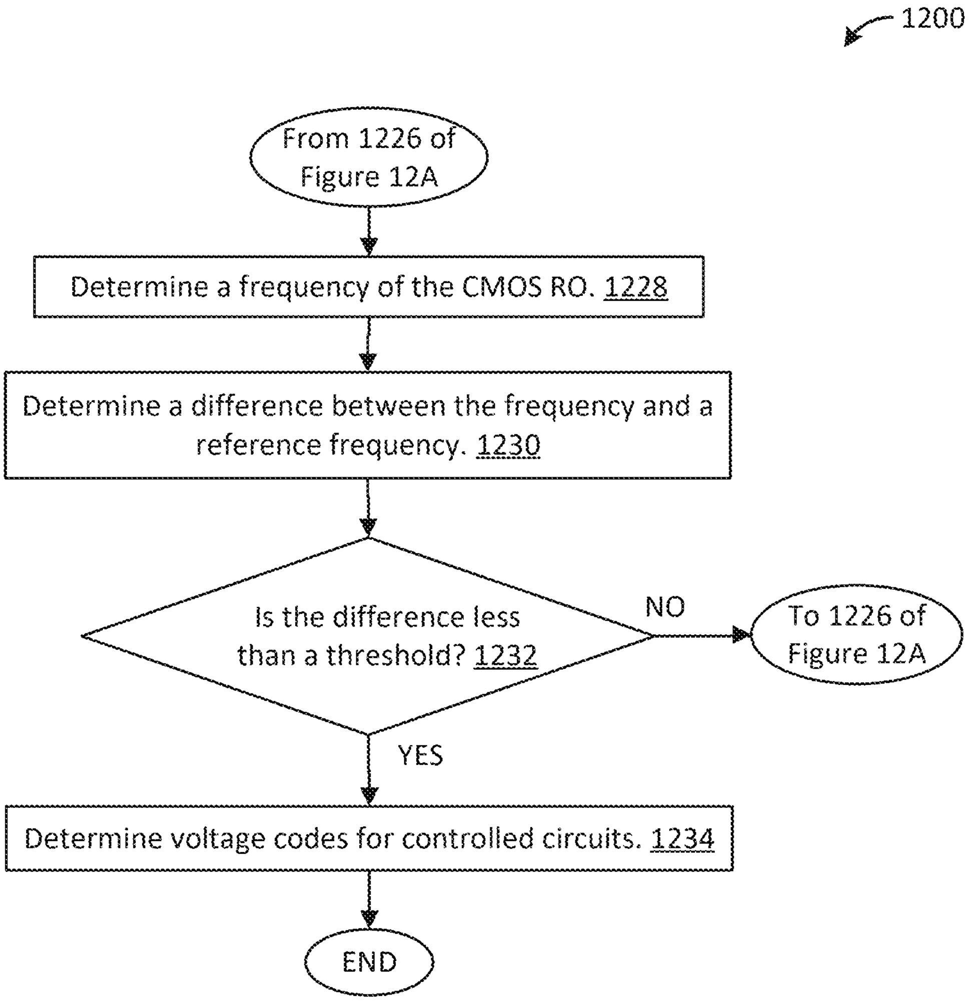

FIGS. 12A and 12B illustrate a flowchart of a method 1200 for operating the adaptive voltage scaling system (e.g., AVS system 102 of FIG. 1), in accordance with some implementations. The method 1200 is described in conjunction with FIGS. 1-7. The method 1200 may be implemented, at least in part, in the form of executable code (e.g., instructions 130 of FIG. 1) stored on non-transitory, tangible, computer-readable medium (e.g., memory 128 of FIG. 1) that when executed by one or more processors (e.g., processor 140 of FIG. 1) may cause the one or more processors to perform one or more of the steps 1202-1234. Although shown in a particular sequence, it should be appreciated that the steps of method 1200 may be performed in any suitable sequence.

The method 1200 starts with step 1202, when a processor (e.g., processor 140 of FIG. 1) of a controller (e.g., controller 126 of FIG. 1) of the AVS system (e.g., AVS system 102 of FIG. 1) sets a CMOS RO (e.g., CMOS RO 118 of FIG. 1) to the burst mode. In some implementations when the CMOS RO is implemented by CMOS RO 400 of FIG. 4, the burst mode is set by setting the control signals according to the table 600 of FIG. 6. In step 1204, a voltage regulator (e.g., voltage regulator 106 of FIG. 1) sets a supply voltage of the CMOS RO (e.g., CMOS RO 118 of FIG. 1). In some implementations, the processor (e.g., processor 140 of FIG. 1) may send instructions to the voltage regulator (e.g., voltage regulator 106 of FIG. 1) to set the supply voltage of the CMOS RO (e.g., CMOS RO 118 of FIG. 1).

In step 1206, the processor (e.g., processor 140 of FIG. 1) sets a time window. In step 1208, a frequency counter circuit (e.g., frequency counter circuit 124 of FIG. 1) counts a number of pulses within the time window. In step 1210, the processor (e.g., processor 140 of FIG. 1) determines whether the number of pulses is less than a threshold. In response to determining at step 1210 that the number of pulses is greater than or equal to the threshold, the method 1200 proceeds to step 1212.

In step 1212, the processor (e.g., processor 140 of FIG. 1) identifies a process corner as a balanced process corner. In step 1214, the processor (e.g., processor 140 of FIG. 1) operates a CMOS RO (e.g., CMOS RO 118 of FIG. 1) in the oscillation mode to determine voltage codes (e.g., vreg_rx<5:0>, vreg_tx<5:0>, vreg_pll<5:0> of FIG. 1) for controlled circuits (e.g., circuits 146, 150, and 154 of FIG. 1). In some implementations, the step 1214 may be performed according to the method 1100 described above with reference to FIG. 11. After step 1214, the method 1200 proceeds to end.

In response to determining at step 1210 that the number of pulses is less than the threshold, the method 1200 proceeds to step 1216. In step 1216, the processor (e.g., processor 140 of FIG. 1) identifies a process corner as a skewed process corner. In step 1218, the processor (e.g., processor 140 of FIG. 1) determines the final state of the CMOS RO (e.g., CMOS RO 118 of FIG. 1). In step 1220, the processor (e.g., processor 140 of FIG. 1) determines whether the final state is LOW or HIGH.

In response to determining at step 1220 that the final state is LOW, method 1200 proceeds to step 1222. In step 1222, the processor (e.g., processor 140 of FIG. 1) identifies the skewed process corner as FS. In response to determining at step 1220 that the final state is HIGH, method 1200 proceeds to step 1224. In step 1224, the processor (e.g., processor 140 of FIG. 1) identifies the skewed process corner as SF. After steps 1222 or 1224, the method 1200 proceeds to step 1226.

In step 1226, the voltage regulator (e.g., voltage regulator 106 of FIG. 1) adjusts the supply voltage of the CMOS RO (e.g., CMOS RO 118 of FIG. 1). In some implementations, the processor (e.g., processor 140 of FIG. 1) may send instructions to the voltage regulator (e.g., voltage regulator 106 of FIG. 1) to adjust the supply voltage of the CMOS RO (e.g., CMOS RO 118 of FIG. 1). In step 1228, a frequency of the CMOS RO (e.g., CMOS RO 118 of FIG. 1) is determined using a frequency counter circuit (e.g., frequency counter circuit 124 of FIG. 1). In step 1230, the processor (e.g., processor 140 of FIG. 1) determines a difference between the frequency and a reference frequency.

In step 1232, the processor (e.g., processor 140 of FIG. 1) determines whether the difference is less than a threshold. In response to determining at step 1342 that the difference is greater or equal to the threshold, the method 1200 proceeds back to step 1226. In some implementations, steps 1226-1232 may be repeated one or more times until the difference is less than the threshold.

In response to determining at step 1232 that the difference is less than the threshold, the method 1200 proceeds to step 1234. In step 1234, the processor (e.g., processor 140 of FIG. 1) determines voltage codes (e.g., vreg_rx<5:0>, vreg_tx<5:0>, vreg_pll<5:0> of FIG. 1) for controlled circuits (e.g., circuits 146, 150, and 154 of FIG. 1) based the adjusted supply voltage. After step 1234, the method 1200 ends.

Figure 13:
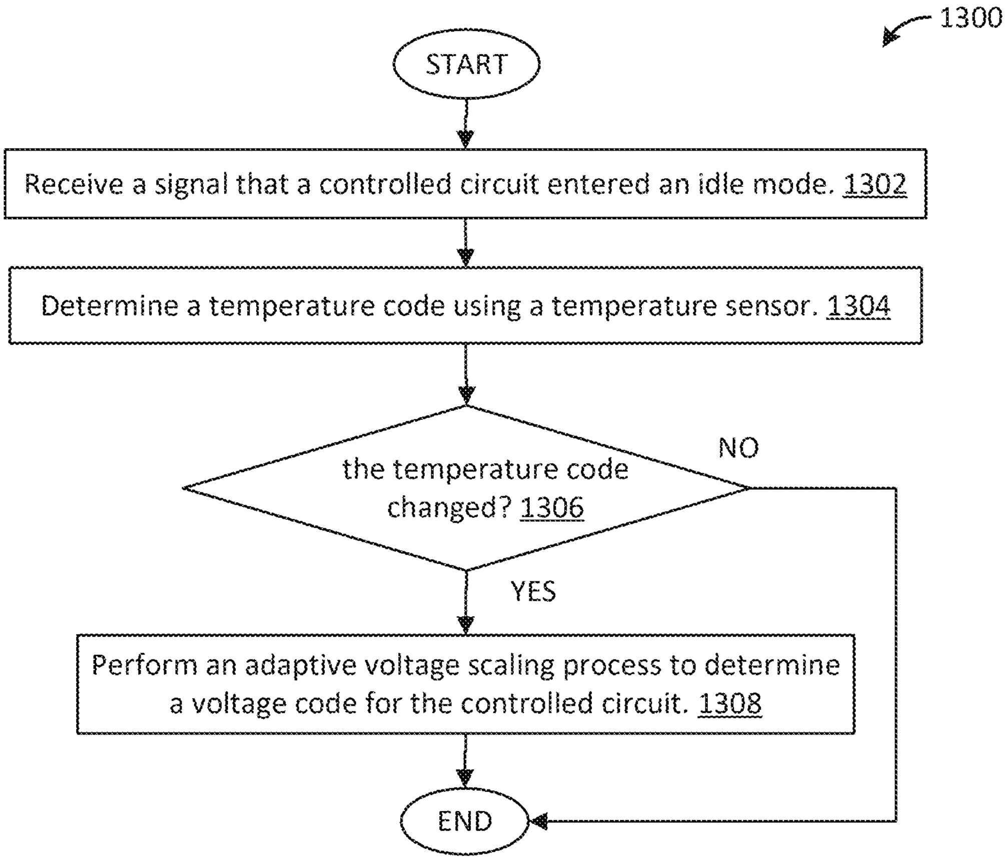
FIG. 13 illustrates a flowchart of a method for operating adaptive voltage scaling system, in accordance with some implementations.

FIG. 13 illustrates a flowchart of a method 1300 for operating the adaptive voltage scaling system (e.g., AVS system 102 of FIG. 1), in accordance with some implementations. The method 1300 is described in conjunction with FIG. 1. The method 1300 may be implemented, at least in part, in the form of executable code (e.g., instructions 130 of FIG. 1) stored on non-transitory, tangible, computer-readable medium (e.g., memory 128 of FIG. 1) that when executed by one or more processors (e.g., processor 140 of FIG. 1) may cause the one or more processors to perform one or more of the steps 1302-1308. Although shown in a particular sequence, it should be appreciated that the steps of method 1300 may be performed in any suitable sequence.

The method 1300 starts with step 1302, when a processor (e.g., processor 140 of FIG. 1) of a controller (e.g., controller 126 of FIG. 1) of the AVS system (e.g., AVS system 102 of FIG. 1) receives a signal that a controlled circuit (e.g., circuits 146, 150, or 154 of FIG. 1) has entered an idle mode. In step 1304, a temperature sensor (e.g., temperature sensor 122 of FIG. 1) determines a temperature code that corresponds to a temperature of a die. In step 1304, the processor (e.g., processor 140 of FIG. 1) determines whether the temperature code changed indicating a temperature change.

In response to determining at step 1306 that the temperature code did not change, the method 1300 proceeds to end. In response to determining at step 1306 that the temperature code changed, the method 1300 proceeds to step 1308. In step 1308, the processor (e.g., processor 140 of FIG. 1) performs an adaptive voltage scaling process to determine a voltage code for the controlled circuit. In some implementations, step 1308 may be performed according to the methods 900 or 1000 (see FIGS. 9A, 9B, and 10). After step 1308, the method 1300 ends.

Figure 14:
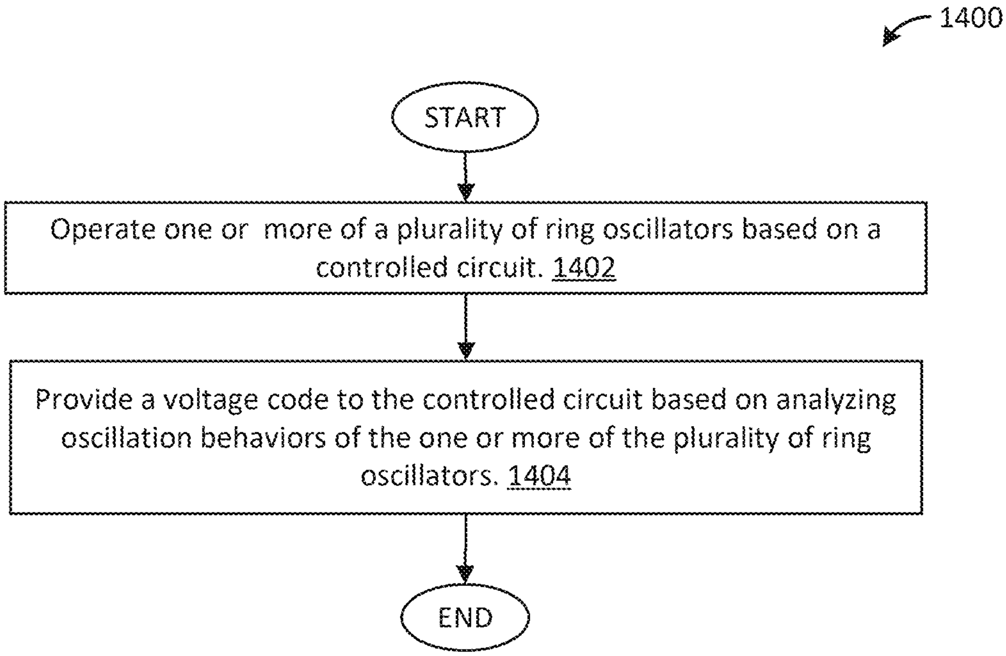
FIG. 14 illustrates a flowchart of a method for operating adaptive voltage scaling system, in accordance with some implementations.

FIG. 14 illustrates a flowchart of a method 1400 for operating the adaptive voltage scaling system (e.g., AVS system 102 of FIG. 1), in accordance with some implementations. The method 1300 is described in conjunction with FIG. 1. The method 1400 may be implemented, at least in part, in the form of executable code (e.g., instructions 130 of FIG. 1) stored on non-transitory, tangible, computer-readable medium (e.g., memory 128 of FIG. 1) that when executed by one or more processors (e.g., processor 140 of FIG. 1) may cause the one or more processors to perform one or more of the steps 1402 and 1404. Although shown in a particular sequence, it should be appreciated that the steps of method 1400 may be performed in any suitable sequence.

The method 1400 starts with step 1402, when a processor (e.g., processor 140 of FIG. 1) of a controller (e.g., controller 126 of FIG. 1) of the AVS system (e.g., AVS system 102 of FIG. 1) operates one or more of a plurality of ring oscillators (e.g., NMOS RO 114, PMOS RO 116, and CMOS RO 118 of FIG. 1) based on a controlled circuit (e.g., circuits 146, 150, or 154 of FIG. 1). In some implementations, the plurality of ring oscillators (e.g., NMOS RO 114, PMOS RO 116, and CMOS RO 118 of FIG. 1) comprise an NMOS ring oscillator (e.g., NMOS RO 114 of FIG. 1), a PMOS ring oscillator (e.g., PMOS RO 116 of FIG. 1), and a CMOS ring oscillator (e.g., CMOS RO 118 of FIG. 1). In an implementation when the controlled circuit (e.g., circuits 146, 150, or 154 of FIG. 1) comprises NMOS transistors, the processor (e.g., processor 140 of FIG. 1) operates the NMOS ring oscillator (e.g., NMOS RO 114 of FIG. 1). In another implementation when the controlled circuit (e.g., circuits 146, 150, or 154 of FIG. 1) comprises PMOS transistors, the processor (e.g., processor 140 of FIG. 1) operates the PMOS ring oscillator (e.g., PMOS RO 116 of FIG. 1). In yet another implementation when the controlled circuit (e.g., circuits 146, 150, or 154 of FIG. 1) comprises CMOS transistors, the processor (e.g., processor 140 of FIG. 1) operates the CMOS ring oscillator (e.g., CMOS RO 118 of FIG. 1).

In step 1404, the processor (e.g., processor 140 of FIG. 1) provides a voltage code (e.g., vreg_rx<5:0>, vreg_tx<5:0>, or vreg_pll<5:0> of FIG. 1) to the controlled circuit (e.g., circuits 146, 150, or 154 of FIG. 1) based on oscillation behaviors of the one or more of the plurality of ring oscillators (e.g., NMOS RO 114, PMOS RO 116, and CMOS RO 118 of FIG. 1). In an implementation, step 1404 may be performed according to the method 900 (see FIGS. 9A and 9B). In another implementation, step 1404 may be performed according to the method 1000 (see FIG. 10). In yet another implementation, step 1404 may be performed according to the method 1100 (see FIG. 11). In yet another implementation, step 1404 may be performed according to the method 1200 (see FIGS. 12A and 12B). After step 1404, the method 1400 ends.

In an implementation, a system includes: a plurality of ring oscillators; a controlled circuit; and a controller operably coupled to the plurality of ring oscillators and the controlled circuit, where the controller is configured to: operate one or more of the plurality of ring oscillators based on the controlled circuit; and provide a voltage code to the controlled circuit based on analyzing oscillation behaviors of the one or more of the plurality of ring oscillators. In an implementation, providing the voltage code to the controlled circuit includes: retrieving the voltage code from a look-up table; and sending the voltage code to the controlled circuit. In an implementation, the plurality of ring oscillators include an NMOS ring oscillator, a PMOS ring oscillator and a CMOS ring oscillator; operating the one or more of the plurality of ring oscillators based on the controlled circuit includes operating the NMOS ring oscillator when the controlled circuit includes NMOS transistors; operating the one or more of the plurality of ring oscillators based on the controlled circuit includes operating the PMOS ring oscillator when the controlled circuit includes PMOS transistors;

and operating the one or more of the plurality of ring oscillators based on the controlled circuit includes operating the NMOS ring oscillator, the PMOS ring oscillator and the CMOS ring oscillator when the controlled circuit includes both NMOS transistors and PMOS transistors. In an implementation, the controller is further configured to: operate the NMOS ring oscillator in an oscillation mode; and provide the voltage code to the controlled circuit based on analyzing oscillation behavior of the NMOS ring oscillator. In an implementation providing the voltage code to the controlled circuit based on analyzing the oscillation behavior of the NMOS ring oscillator includes: adjusting a supply voltage of the NMOS ring oscillator until a frequency of the NMOS ring oscillator matches a reference frequency within a threshold; and storing the voltage code of the controlled circuit in a look-up table, where the voltage code of the controlled circuit is determined based on a voltage code of the NMOS ring oscillator, and where the voltage code of the NMOS ring oscillator is determined based on the adjusted supply voltage. In an implementation, the system further includes a temperature sensor operably coupled to the controller, where the controller is further configured to: receive a temperature code from the temperature sensor, where the temperature code corresponds to a temperature sensed by the temperature sensor; shift the voltage code of the NMOS ring oscillator by a temperature-dependent value to normalize the voltage code of the NMOS ring oscillator, where the temperature-dependent value is proportional to the sensed temperature; and adjust a process corner of the NMOS ring oscillator based on the normalized voltage code. In an implementation, the controller is further configured to: operate the PMOS ring oscillator in an oscillation mode; and provide the voltage code to the controlled circuit based on analyzing oscillation behavior of the PMOS ring oscillator. In an implementation, the controller is further configured to: operate the CMOS ring oscillator in an oscillation mode; and provide the voltage code to the controlled circuit based on analyzing oscillation behavior of the CMOS ring oscillator. In an implementation, the controller is further configured to: operate the CMOS ring oscillator in a burst mode; and provide the voltage code to the controlled circuit based on analyzing oscillation behavior of the CMOS ring oscillator. In an implementation, providing the voltage code to the controlled circuit based on analyzing the oscillation behavior of the CMOS ring oscillator includes: adjusting a supply voltage of the CMOS ring oscillator until the CMOS ring oscillator exhibits non-decaying oscillations; further adjusting the supply voltage of the CMOS ring oscillator until a frequency of the CMOS ring oscillator matches a reference frequency within a threshold; and storing the voltage code of the controlled circuit in a look-up table, where the voltage code of the controlled circuit is determined based on a voltage code of the CMOS ring oscillator, and where the voltage code of the CMOS ring oscillator is determined based on the adjusted supply voltage.

In another implementation, a device includes: a processor; and a non-transitory computer-readable medium storing instructions which, when executed by the processor, cause the processor to: operate one or more of a plurality of ring oscillators based on a controlled circuit; and provide a voltage code to the controlled circuit based on analyzing oscillation behaviors of the one or more of the plurality of ring oscillators. In an implementation, providing the voltage code to the controlled circuit includes: retrieving the voltage code from a look-up table; and sending the voltage code to the controlled circuit. In an implementation, the plurality of ring oscillators include an NMOS ring oscillator, a PMOS ring oscillator and a CMOS ring oscillator; operating the one or more of the plurality of ring oscillators based on the controlled circuit includes operating the NMOS ring oscillator when the controlled circuit includes NMOS transistors; and the instructions, when executed by the processor, further cause the processor to: operate the NMOS ring oscillator in an oscillation mode; adjust a supply voltage of the NMOS ring oscillator until a frequency of the NMOS ring oscillator matches a reference frequency within a threshold; and store the voltage code of the controlled circuit in a look-up table, where the voltage code of the controlled circuit is determined based on a voltage code of the NMOS ring oscillator, and where the voltage code of the NMOS ring oscillator is determined based on the adjusted supply voltage. In an implementation, the plurality of ring oscillators include an NMOS ring oscillator, a PMOS ring oscillator and a CMOS ring oscillator; operating the one or more of the plurality of ring oscillators based on the controlled circuit includes operating the PMOS ring oscillator when the controlled circuit includes PMOS transistors; and the instructions, when executed by the processor, further cause the processor to: operate the PMOS ring oscillator in an oscillation mode; adjust a supply voltage of the PMOS ring oscillator until a frequency of the PMOS ring oscillator matches a reference frequency within a threshold; and store the voltage code of the controlled circuit in a look-up table, where the voltage code of the controlled circuit is determined based on a voltage code of the PMOS ring oscillator, and where the voltage code of the PMOS ring oscillator is determined based on the adjusted supply voltage. In an implementation, the plurality of ring oscillators includes an NMOS ring oscillator, a PMOS ring oscillator and a CMOS ring oscillator; operating the one or more of the plurality of ring oscillators based on the controlled circuit includes operating the NMOS ring oscillator, the PMOS ring oscillator and the CMOS ring oscillator when the controlled circuit includes both NMOS transistors and PMOS transistors; and the instructions, when executed by the processor, further cause the processor to: operate the CMOS ring oscillator in a burst mode; adjust a supply voltage of the CMOS ring oscillator until the CMOS ring oscillator exhibits non-decaying oscillations; further adjust the supply voltage of the CMOS ring oscillator until a frequency of the CMOS ring oscillator matches a reference frequency within a threshold; and store the voltage code of the controlled circuit in a look-up table, where the voltage code of the controlled circuit is determined based on a voltage code of the CMOS ring oscillator, and where the voltage code of the CMOS ring oscillator is determined based on the adjusted supply voltage.

In yet another implementation, a method includes: operating one or more of a plurality of ring oscillators based on a controlled circuit; and providing a voltage code to the controlled circuit based on analyzing oscillation behaviors of the one or more of the plurality of ring oscillators. In an implementation, providing the voltage code to the controlled circuit includes: retrieving the voltage code from a look-up table; and sending the voltage code to the controlled circuit. In an implementation, the plurality of ring oscillators include an NMOS ring oscillator, a PMOS ring oscillator and a CMOS ring oscillator; operating the one or more of the plurality of ring oscillators based on the controlled circuit includes operating the NMOS ring oscillator when the controlled circuit includes NMOS transistors; and the method further includes: operating the NMOS ring oscillator in an oscillation mode; adjusting a supply voltage of the NMOS ring oscillator until a frequency of the NMOS ring oscillator matches a reference frequency within a threshold;

and storing the voltage code of the controlled circuit in a look-up table, where the voltage code of the controlled circuit is determined based on a voltage code of the NMOS ring oscillator, and where the voltage code of the NMOS ring oscillator is determined based on the adjusted supply voltage. In an implementation, the plurality of ring oscillators include an NMOS ring oscillator, a PMOS ring oscillator and a CMOS ring oscillator; operating the one or more of the plurality of ring oscillators based on the controlled circuit includes operating the PMOS ring oscillator when the controlled circuit includes PMOS transistors; and the method further includes: operating the PMOS ring oscillator in an oscillation mode; adjusting a supply voltage of the PMOS ring oscillator until a frequency of the PMOS ring oscillator matches a reference frequency within a threshold; and storing the voltage code of the controlled circuit in a look-up table, where the voltage code of the controlled circuit is determined based on a voltage code of the PMOS ring oscillator, and where the voltage code of the PMOS ring oscillator is determined based on the adjusted supply voltage. In an implementation, the plurality of ring oscillators include an NMOS ring oscillator, a PMOS ring oscillator and a CMOS ring oscillator; operating the one or more of the plurality of ring oscillators based on the controlled circuit includes operating the NMOS ring oscillator, the PMOS ring oscillator and the CMOS ring oscillator when the controlled circuit includes both NMOS transistors and PMOS transistors; and the method further includes: operating the CMOS ring oscillator in a burst mode; adjusting a supply voltage of the CMOS ring oscillator until the CMOS ring oscillator exhibits non-decaying oscillations; further adjusting the supply voltage of the CMOS ring oscillator until a frequency of the CMOS ring oscillator matches a reference frequency within a threshold; and storing the voltage code of the controlled circuit in a look-up table, where the voltage code of the controlled circuit is determined based on a voltage code of the CMOS ring oscillator, and where the voltage code of the CMOS ring oscillator is determined based on the adjusted supply voltage.

The adaptive scaling process allows the system to maintain optimal voltage levels for controlled circuits even during idle operation, compensating for temperature-induced variations while minimizing unnecessary adjustments when conditions remain stable.

While the present disclosure has been described with reference to illustrative implementations, this description is not intended to be construed in a limiting sense. Various modifications and combinations of the illustrative implementations, as well as other implementations of the present disclosure, will be apparent to persons skilled in the art upon reference to the description. It is therefore intended that the appended claims encompass any such modifications or implementations.

What is claimed is:

1. A system comprising:

a plurality of ring oscillators comprising an NMOS ring oscillator, a PMOS ring oscillator and a CMOS ring oscillator;

a controlled circuit; and a controller operably coupled to the plurality of ring oscillators and the controlled circuit, wherein the controller is configured to:

operate one or more of the plurality of ring oscillators based on the controlled circuit; and provide a voltage code to the controlled circuit based on analyzing oscillation behaviors of the one or more of the plurality of ring oscillators.

2. The system of claim 1, wherein providing the voltage code to the controlled circuit comprises:

retrieving the voltage code from a look-up table; and sending the voltage code to the controlled circuit.

3. The system of claim 1, wherein:

operating the one or more of the plurality of ring oscillators based on the controlled circuit comprises operating the NMOS ring oscillator when the controlled circuit comprises NMOS transistors;

operating the one or more of the plurality of ring oscillators based on the controlled circuit comprises operating the PMOS ring oscillator when the controlled circuit comprises PMOS transistors; and operating the one or more of the plurality of ring oscillators based on the controlled circuit comprises operating the NMOS ring oscillator, the PMOS ring oscillator and the CMOS ring oscillator when the controlled circuit comprises both NMOS transistors and PMOS transistors.

4. The system of claim 3, wherein the controller is further configured to:

operate the NMOS ring oscillator in an oscillation mode; and provide the voltage code to the controlled circuit based on analyzing oscillation behavior of the NMOS ring oscillator.

5. The system of claim 4, wherein providing the voltage code to the controlled circuit based on analyzing the oscillation behavior of the NMOS ring oscillator comprises:

adjusting a supply voltage of the NMOS ring oscillator until a frequency of the NMOS ring oscillator matches a reference frequency within a threshold; and storing the voltage code of the controlled circuit in a look-up table, wherein the voltage code of the controlled circuit is determined based on a voltage code of the NMOS ring oscillator, and wherein the voltage code of the NMOS ring oscillator is determined based on the adjusted supply voltage.

6. The system of claim 5, further comprising a temperature sensor operably coupled to the controller, wherein the controller is further configured to:

receive a temperature code from the temperature sensor, wherein the temperature code corresponds to a temperature sensed by the temperature sensor;

shift the voltage code of the NMOS ring oscillator by a temperature-dependent value to normalize the voltage code of the NMOS ring oscillator, wherein the temperature-dependent value is proportional to the sensed temperature; and adjust a process corner of the NMOS ring oscillator based on the normalized voltage code.

7. The system of claim 3, wherein the controller is further configured to:

operate the PMOS ring oscillator in an oscillation mode; and provide the voltage code to the controlled circuit based on analyzing oscillation behavior of the PMOS ring oscillator.

8. The system of claim 3, wherein the controller is further configured to:

operate the CMOS ring oscillator in an oscillation mode; and provide the voltage code to the controlled circuit based on analyzing oscillation behavior of the CMOS ring oscillator.

9. The system of claim 3, wherein the controller is further configured to:

operate the CMOS ring oscillator in a burst mode; and provide the voltage code to the controlled circuit based on analyzing oscillation behavior of the CMOS ring oscillator.

10. The system of claim 9, wherein providing the voltage code to the controlled circuit based on analyzing the oscillation behavior of the CMOS ring oscillator comprises:

adjusting a supply voltage of the CMOS ring oscillator until the CMOS ring oscillator exhibits non-decaying oscillations;

further adjusting the supply voltage of the CMOS ring oscillator until a frequency of the CMOS ring oscillator matches a reference frequency within a threshold; and storing the voltage code of the controlled circuit in a look-up table, wherein the voltage code of the controlled circuit is determined based on a voltage code of the CMOS ring oscillator, and wherein the voltage code of the CMOS ring oscillator is determined based on the adjusted supply voltage.

11. A device comprising:

a processor; and a non-transitory computer-readable medium storing instructions which, when executed by the processor, cause the processor to:

operate one or more of a plurality of ring oscillators based on a controlled circuit, wherein the plurality of ring oscillators comprise an NMOS ring oscillator, a PMOS ring oscillator and a CMOS ring oscillator; and provide a voltage code to the controlled circuit based on analyzing oscillation behaviors of the one or more of the plurality of ring oscillators.

12. The device of claim 11, wherein providing the voltage code to the controlled circuit comprises:

retrieving the voltage code from a look-up table; and sending the voltage code to the controlled circuit.

13. The device of claim 11, wherein:

operating the one or more of the plurality of ring oscillators based on the controlled circuit comprises operating the NMOS ring oscillator when the controlled circuit comprises NMOS transistors; and the instructions, when executed by the processor, further cause the processor to:

operate the NMOS ring oscillator in an oscillation mode;

adjust a supply voltage of the NMOS ring oscillator until a frequency of the NMOS ring oscillator matches a reference frequency within a threshold; and store the voltage code of the controlled circuit in a look-up table, wherein the voltage code of the controlled circuit is determined based on a voltage code of the NMOS ring oscillator, and wherein the voltage code of the NMOS ring oscillator is determined based on the adjusted supply voltage.

14. The device of claim 11, wherein:

operating the one or more of the plurality of ring oscillators based on the controlled circuit comprises operating the PMOS ring oscillator when the controlled circuit comprises PMOS transistors; and the instructions, when executed by the processor, further cause the processor to:

operate the PMOS ring oscillator in an oscillation mode;

adjust a supply voltage of the PMOS ring oscillator until a frequency of the PMOS ring oscillator matches a reference frequency within a threshold; and store the voltage code of the controlled circuit in a look-up table, wherein the voltage code of the controlled circuit is determined based on a voltage code of the PMOS ring oscillator, and wherein the voltage code of the PMOS ring oscillator is determined based on the adjusted supply voltage.

15. The device of claim 11, wherein:

operating the one or more of the plurality of ring oscillators based on the controlled circuit comprises operating the NMOS ring oscillator, the PMOS ring oscillator and the CMOS ring oscillator when the controlled circuit comprises both NMOS transistors and PMOS transistors; and the instructions, when executed by the processor, further cause the processor to:

operate the CMOS ring oscillator in a burst mode;

adjust a supply voltage of the CMOS ring oscillator until the CMOS ring oscillator exhibits non-decaying oscillations;

further adjust the supply voltage of the CMOS ring oscillator until a frequency of the CMOS ring oscillator matches a reference frequency within a threshold; and store the voltage code of the controlled circuit in a look-up table, wherein the voltage code of the controlled circuit is determined based on a voltage code of the CMOS ring oscillator, and wherein the voltage code of the CMOS ring oscillator is determined based on the adjusted supply voltage.

16. A method comprising:

operating one or more of a plurality of ring oscillators based on a controlled circuit, wherein the plurality of ring oscillators comprise an NMOS ring oscillator, a PMOS ring oscillator and a CMOS ring oscillator; and providing a voltage code to the controlled circuit based on analyzing oscillation behaviors of the one or more of the plurality of ring oscillators.

17. The method of claim 16, wherein providing the voltage code to the controlled circuit comprises:

retrieving the voltage code from a look-up table; and sending the voltage code to the controlled circuit.

18. The method of claim 16, wherein:

operating the one or more of the plurality of ring oscillators based on the controlled circuit comprises operating the NMOS ring oscillator when the controlled circuit comprises NMOS transistors; and the method further comprises:

operating the NMOS ring oscillator in an oscillation mode;

adjusting a supply voltage of the NMOS ring oscillator until a frequency of the NMOS ring oscillator matches a reference frequency within a threshold; and storing the voltage code of the controlled circuit in a look-up table, wherein the voltage code of the controlled circuit is determined based on a voltage code of the NMOS ring oscillator, and wherein the voltage code of the NMOS ring oscillator is determined based on the adjusted supply voltage.

19. The method of claim 16, wherein:

operating the one or more of the plurality of ring oscillators based on the controlled circuit comprises operating the PMOS ring oscillator when the controlled circuit comprises PMOS transistors; and the method further comprises:

operating the PMOS ring oscillator in an oscillation mode;

adjusting a supply voltage of the PMOS ring oscillator until a frequency of the PMOS ring oscillator matches a reference frequency within a threshold; and storing the voltage code of the controlled circuit in a look-up table, wherein the voltage code of the controlled circuit is determined based on a voltage code of the PMOS ring oscillator, and wherein the voltage code of the PMOS ring oscillator is determined based on the adjusted supply voltage.

20. The method of claim 16, wherein:

operating the one or more of the plurality of ring oscillators based on the controlled circuit comprises operating the NMOS ring oscillator, the PMOS ring oscillator and the CMOS ring oscillator when the controlled circuit comprises both NMOS transistors and PMOS transistors; and the method further comprises:

operating the CMOS ring oscillator in a burst mode;

adjusting a supply voltage of the CMOS ring oscillator until the CMOS ring oscillator exhibits non-decaying oscillations;

further adjusting the supply voltage of the CMOS ring oscillator until a frequency of the CMOS ring oscillator matches a reference frequency within a threshold; and storing the voltage code of the controlled circuit in a look-up table, wherein the voltage code of the controlled circuit is determined based on a voltage code of the CMOS ring oscillator, and wherein the voltage code of the CMOS ring oscillator is determined based on the adjusted supply voltage.

* * * * *